(12) United States Patent
Shim et al.

(10) Patent No.: US 10,903,299 B2
(45) Date of Patent: Jan. 26, 2021

(54) DISPLAY DEVICE INCLUDING A FLEXIBLE DISPLAY PANEL

(71) Applicant: SAMSUNG DISPLAY CO., LTD., Yongin-si (KR)

(72) Inventors: Donghwan Shim, Hwaseong-si (KR); Taehyun Kim, Seoul (KR); Sangho Park, Hwaseong-si (KR); Seungmin Lee, Hwaseong-si (KR); Seunghwan Cho, Yongin-si (KR); Jonghyun Choi, Seoul (KR)

(73) Assignee: SAMSUNG DISPLAY CO., , LTD., Yongin-si (KR)

( * ) Notice: Subject to any disclaimer, the term of this patent is extended or adjusted under 35 U.S.C. 154(b) by 85 days.

(21) Appl. No.: 16/131,784

(22) Filed: Sep. 14, 2018

(65) Prior Publication Data

US 2019/0081127 A1 Mar. 14, 2019

(30) Foreign Application Priority Data

Sep. 14, 2017 (KR) .................. 10-2017-0117592

(51) Int. Cl.
*H01L 27/32* (2006.01)
*H01L 51/00* (2006.01)
*H01L 27/12* (2006.01)
*G09G 3/3291* (2016.01)
*G06F 1/16* (2006.01)
*G09G 3/3225* (2016.01)
*G02B 30/00* (2020.01)

(52) U.S. Cl.
CPC ........ *H01L 27/3276* (2013.01); *G06F 1/1601* (2013.01); *G06F 1/1652* (2013.01); *G09G 3/3291* (2013.01); *H01L 27/124* (2013.01); *H01L 27/1218* (2013.01); *H01L 51/0097* (2013.01); *G02B 30/00* (2020.01); *G09G 3/3225* (2013.01); *G09G 2300/0426* (2013.01); *H01L 2251/5338* (2013.01)

(58) Field of Classification Search
CPC combination set(s) only.
See application file for complete search history.

(56) References Cited

U.S. PATENT DOCUMENTS 8,077,235 B2 12/2011 Street
8,976,141 B2 3/2015 Myers et al.
9,429,997 B2 8/2016 Myers et al.
(Continued)

FOREIGN PATENT DOCUMENTS

JP 2008307084 12/2008
KR 101642808 7/2016
(Continued)

*Primary Examiner* — Van N Chow
(74) *Attorney, Agent, or Firm* — F. Chau & Associates, LLC

(57) ABSTRACT

A display device includes a substrate. The substrate includes a front surface display portion. A first side surface display portion is bent from a first side of the front surface display portion. A second side surface display portion is bent from a second side of the front surface display portion. A corner display portion extends from the first side surface display portion and the second side surface display portion. The substrate has a through hole defined by the front surface display portion and the corner display portion.

16 Claims, 26 Drawing Sheets

(56) References Cited

U.S. PATENT DOCUMENTS

| | | | |
|---|---|---|---|
| 9,747,825 B2 | 8/2017 | Kim | |
| 9,823,756 B2 | 11/2017 | Kwak et al. | |
| 9,952,626 B2 * | 4/2018 | Jinbo | G06F 1/1677 |
| 10,142,547 B2 * | 11/2018 | Yamazaki | G06F 1/1652 |
| 10,431,604 B2 * | 10/2019 | Cho | H01L 27/3276 |
| 10,600,988 B2 * | 3/2020 | Choi | B32B 3/26 |
| 2015/0138041 A1 * | 5/2015 | Hirakata | H01L 27/3262 345/1.3 |
| 2015/0346991 A1 * | 12/2015 | Kwak | G06F 3/0488 715/765 |
| 2017/0161006 A1 | 6/2017 | Kwon et al. | |
| 2017/0206835 A1 | 7/2017 | Hirakata et al. | |

FOREIGN PATENT DOCUMENTS

| | | |
|---|---|---|
| KR | 1020160082252 | 7/2016 |
| KR | 1020160105735 | 9/2016 |

* cited by examiner

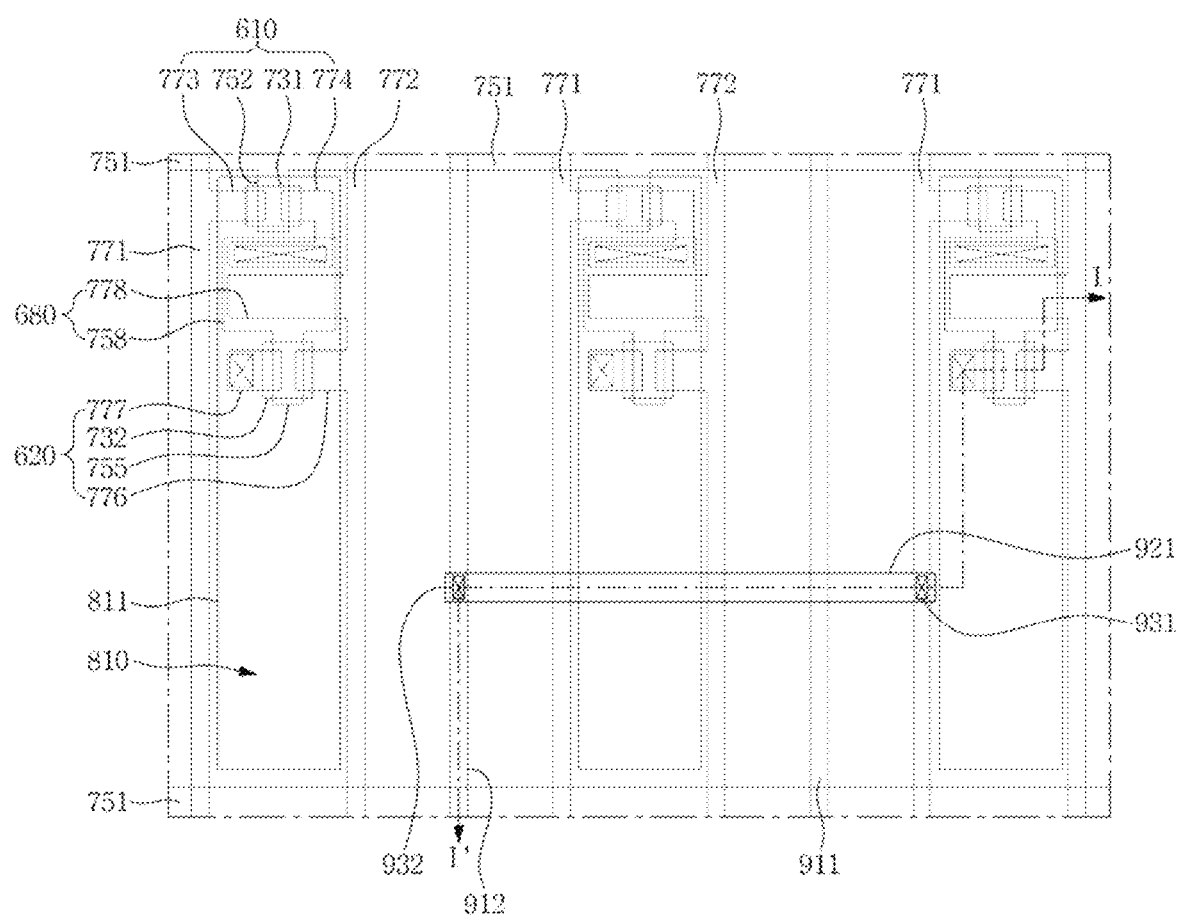

DISPLAY DEVICE INCLUDING A FLEXIBLE DISPLAY PANEL

CROSS-REFERENCE TO RELATED APPLICATION

This application claims priority under 35 U.S.C. § 119 to Korean Patent Application No. 10-2017-0117592, filed on Sep. 14, 2017, in the Korean Intellectual Property Office (KIPO), the disclosure of which is incorporated by reference herein in its entirety.

1. TECHNICAL FIELD

Exemplary embodiments of the present invention relate to a display device, and more particularly, to a display device including a flexible display panel.

2. DISCUSSION OF RELATED ART

Flexible display panels may be bendable. Such flexible display panels may be used in various fields because they may be used in a folded or curved form.

Display elements that may be applicable to the flexible display panels may include organic light emitting diodes ("OLED"), liquid crystal display ("LCD") elements, or electrophoretic display (EPD) elements. For example, OLEDs may be manufactured into a stack structure of a thin film type. Thus, OLEDs may be relatively flexible.

A flexible display device may be a display device capable of being freely bent. A bent or bended display device may be a display device of which a bent shape is maintained.

An edge portion of the flexible display panel of a bent display device may be bent so that images may be displayed on a side surface thereof.

SUMMARY

An exemplary embodiment of the present invention may be directed to a 3D display device displaying images on upper and lower side surfaces and opposite side surfaces.

According to an exemplary embodiment of the present invention, a display device includes a substrate. The substrate includes a front surface display portion. A first side surface display portion is bent from a first side of the front surface display portion. A second side surface display portion is bent from a second side of the front surface display portion. A corner display portion extends from the first side surface display portion and the second side surface display portion. The substrate has a through hole defined by the front surface display portion and the corner display portion.

The corner display portion may include a first side surface corner display portion extending from the first side surface display portion, a second side surface corner display portion extending from the second side surface display portion, and a corner non-display portion between the first side surface corner display portion and the second side surface corner display portion.

The corner non-display portion may include a first folding portion bent and extending from the first side surface corner display portion and a second folding portion bent and extending from the first folding portion and the second side surface corner display portion. At least a portion of the first folding portion may be in direct contact with at least a portion of the second folding portion.

The first folding portion and the second folding portion may overlap one of the first side surface corner display portion and the second side surface corner display portion.

The corner non-display portion need not include a pixel electrode.

The front surface display portion may have a rounded corner.

The corner display portion may have a round shape corresponding to a shape of the corner of the front surface display portion.

According to an exemplary embodiment of the present invention, a display device includes a substrate. The substrate includes a front surface display portion. A first side surface display portion is bent from a first side of the front surface display portion. A second side surface display portion is bent from a second side of the front surface display portion. A corner non-display portion extends from the first side surface display portion and the second side surface display portion. The substrate has a through hole defined by the front surface display portion and the corner non-display portion. The corner non-display portion overlaps the front surface display portion.

The display device may include a buffer film between the corner non-display portion and the front surface display portion.

The buffer film may extend between the corner non-display portion and the first and second side surface display portions.

The first side surface display portion and the second side surface display portion may have sides forming an interior angle larger than about 90 degrees.

The first side surface display portion and the second side surface display portion may have sides forming an interior angle of about 90 degrees.

The display device may include a plurality of pixels on the substrate and arranged in a matrix form. A plurality of gate lines may extend along a first direction and may provide a gate signal to each of the plurality of pixels. A plurality of data lines may extend along a second direction crossing the first direction and may provide a data signal to each of the plurality of pixels.

At least one of the plurality of data lines and the plurality of gate lines may include a first divided wiring and a second divided wiring which are divided by the through hole. At least one of the plurality of data lines and the plurality of gate lines may include a bypass wiring which bypasses the through hole and connects the first divided wiring and the second divided wiring.

The bypass wiring may be disposed so that an insulating layer is disposed between the bypass wiring and each of the first and second divided wirings. The bypass wiring may be connected to the first and second divided wirings through contact holes defined at the insulating layer.

At least one of the contact holes may be located at the front surface display portion.

The display device may include a dummy wiring.

At least one of the plurality of gate lines and the plurality of data lines may be curved along a periphery of the through hole.

The display device may include a gate driver arranged to apply a gate signal to the gate lines divided by the through hole.

The display device may include a data driver arranged to apply a data signal to the data lines divided by the through hole.

The display device may further include a demultiplexer arranged to apply a data signal to the data lines divided by the through hole.

BRIEF DESCRIPTION OF THE DRAWINGS

A more complete appreciation of the present invention will become more apparent by describing in detail exemplary embodiments thereof with reference to the accompanying drawings, in which:

FIG. 14A is a partial enlarged view illustrating a part of a display panel according to an exemplary embodiment of the present invention;

DETAILED DESCRIPTION

Figure 1:
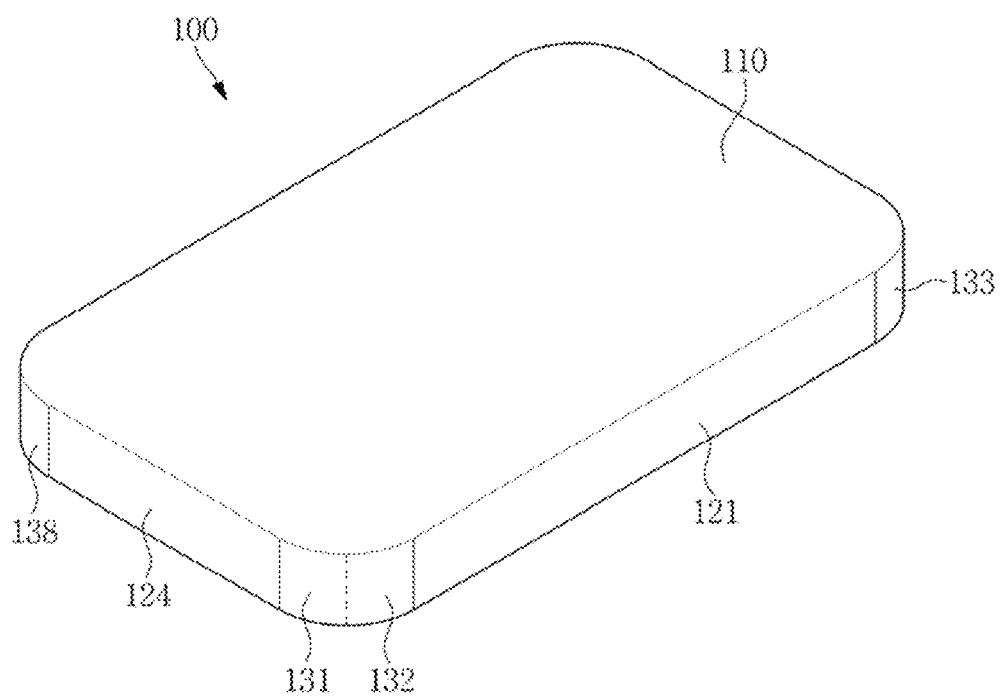
FIG. 1 is an overall perspective view illustrating a display panel according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

Sizes of elements in the drawings may be exaggerated for clarity of description. It will be understood that when a component, such as a layer, a film, a region, or a plate, is referred to as being "on" another component, the component may be directly on the other component or intervening components may be present.

Throughout the specification, when an element is referred to as being "connected" to another element, the element may be "directly connected" to the other element, or "electrically connected" to the other element with one or more intervening elements interposed therebetween.

It will be understood that although the terms "first" and "second" may be used herein to describe various components, these components should not be limited by these terms.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system).

Figure 2A:
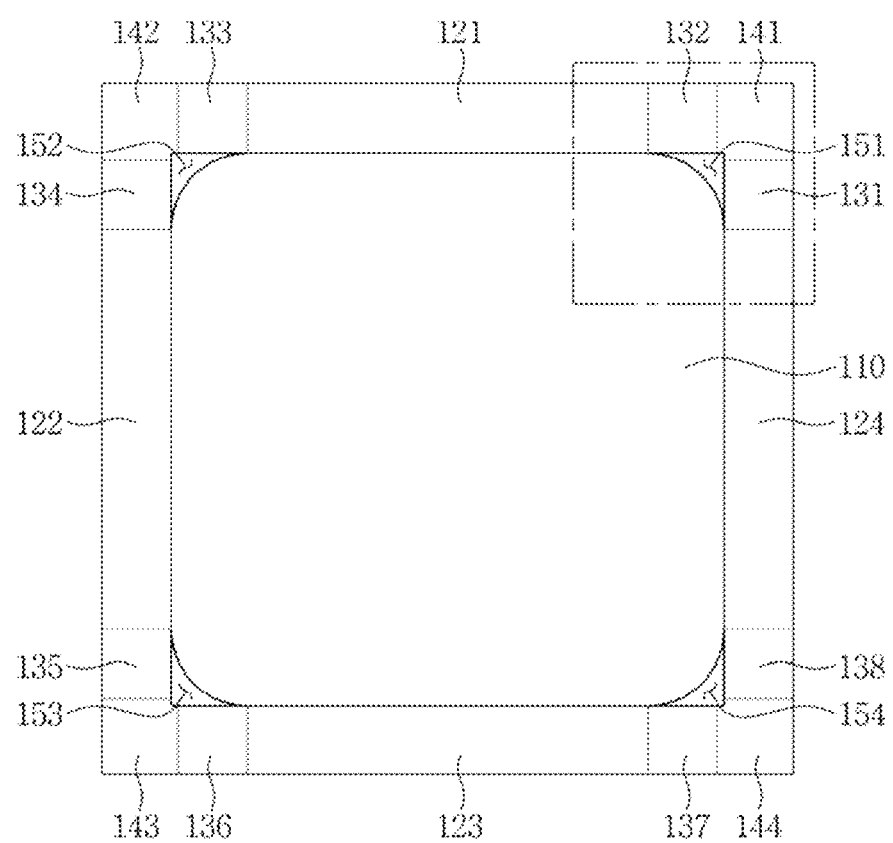
FIG. 2A is a plan view illustrating a display panel according to an exemplary embodiment of the present invention.
Figure 2B:
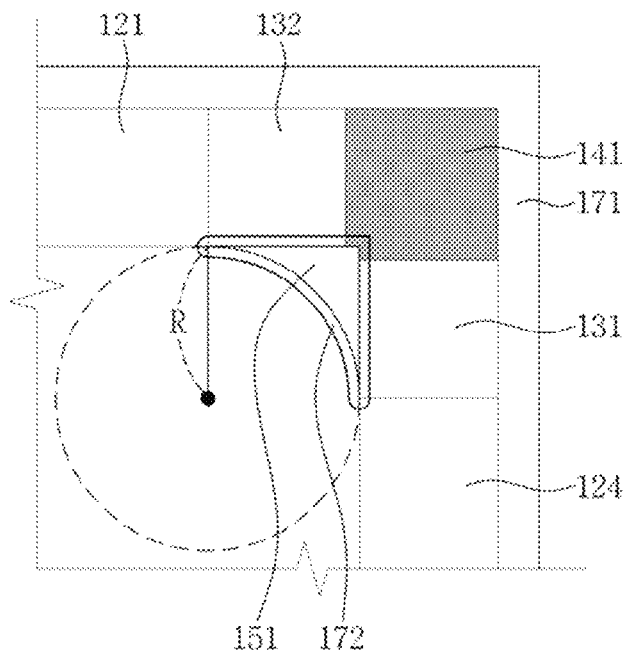
FIG. 2B is a partial enlarged view illustrating a part of the display panel of FIG. 2A.
Figure 2C:
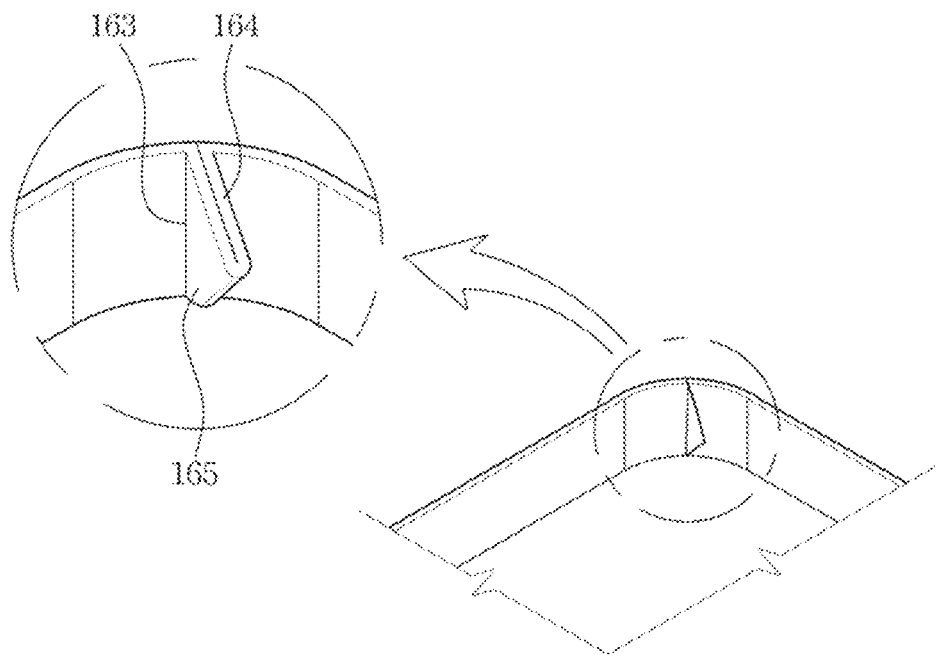
FIG. 2C is a partial enlarged view illustrating a corner of a back surface of a display panel which is bent according to an exemplary embodiment of the present invention.

FIG. 1 is an overall perspective view illustrating a display panel according to an exemplary embodiment of the present invention. FIG. 2A is a plan view illustrating a display panel according to an exemplary embodiment of the present invention. FIG. 2B is a partial enlarged view illustrating a part of the display panel of FIG. 2A. FIG. 2C is a partial enlarged view illustrating a corner of a back surface of a display panel which is bent according to an exemplary embodiment of the present invention.

FIG. 1 is a perspective view illustrating a 3D display panel according to an exemplary embodiment of the present invention, FIG. 2A is an exploded view illustrating the 3D display panel according to an exemplary embodiment of the present invention, FIG. 2B is a partial enlarged view illustrating an upper right through hole of FIG. 2A, and FIG. 2C is a partial enlarged view illustrating a corner of a back surface of a display panel which is bended according to an exemplary embodiment of the present invention.

A display panel 100 according to an exemplary embodiment of the present invention may be formed by bending or folding a flat flexible display panel. The display panel 100 may be a 3-dimensional (3D) display panel. Thus, the display panel 100 may have a bent shape. The display panel 100 according to an exemplary embodiment of the present invention will be described in more detail below with reference to FIGS. 1, 2A, 2B, and 2C.

The display panel 100 according to an exemplary embodiment of the present invention includes a front surface display portion 110, side surface display portions 121, 122, 123, and 124 bent and extending from upper, lower, left and right sides of the front surface display portion 110, and corner display portions 131, 132, 133, 134, 135, 136, 137, and 138 extending from the side surface display portions 121, 122, 123, and 124.

As an example, the front surface display portion 110 may include four sides of a straight line and four corners of a curved line. A side surface display portion 121 may be bended, for example, at about 90 degrees from an upper side of the front surface display portion 110 to extend therefrom, a side surface display portion 122 may be bended, for example, at about 90 degrees from a left side of the front surface display portion 110 to extend therefrom, a side surface display portion 123 may be bended, for example, at about 90 degrees from a lower side of the front surface display portion 110 to extend therefrom, and a side surface display portion 124 may be bended, for example, at about 90 degrees from a right side of the front surface display portion 110 to extend therefrom.

A right side surface corner display portion 131 may extend from the right side surface display portion 124, and an upper side surface corner display portion 132 may extend from the upper side surface display portion 121. A corner non-display portion 141 is disposed between the right side surface corner display portion 131 and the upper side surface corner display portion 132. The corner non-display portion 141 might not be visible from the outside of the display panel 100, as described below in more detail (e.g., with reference to FIGS. 3A to 3C). An upper right corner display portion may include the right side surface corner display portion 131, the upper side surface corner display portion 132, and the corner non-display portion 141 between the right side surface corner display portion 131 and the upper side surface corner display portion 132

Referring to FIGS. 2A and 2B, the display panel 100 may include a through hole 151 defined by the front surface display portion 110, the right side surface corner display portion 131, the upper side surface corner display portion 132, and the corner non-display portion 141 therebetween. Accordingly, the through hole 151 may have an arc shape with two sides (e.g., the right side surface corner display portion 131 and the upper side surface corner display portion 132) contacting the arc. The through hole 151 is a hole which passes through the display panel 100 in an up and down direction (e.g., a direction orthogonal to the front surface display portion 110). A portion 172 of the display panel 100 adjacent to the through hole 151 may be a non-display area.

In an exemplary embodiment of the present invention, the upper side surface corner display portion 132, the right side surface corner display portion 131, and an upper right corner of the front surface display portion 110 may form one corner of the display panel 100. For example, the upper side surface corner display portion 132 and the right side surface corner display portion 131 may form a curved surface along the upper right corner of the front surface display portion 110. As an example, a total sum of a length of upper side surface corner display portion 132 and a length of the right side surface corner display portion 131 may be substantially equal to a length of the upper right corner. Referring to FIG. 2B, for example, when the upper right corner of the front surface display portion 110 has a circular shape having a radius of R, each of the length of upper side surface corner display portion 132 and the length of the right side surface corner display portion 131 may be about πR/4.

Referring to FIG. 2C, the corner non-display portion 141 may include a first folding portion 165 which is bended and extends from the right side surface corner display portion 131 and a second folding portion 164 which is bended and extends from the upper side surface corner display portion 132. The first folding portion 165 and the second folding portion 164 may overlap each other. For example, at least a portion of the first folding portion 165 may be in direct contact with at least a portion of the second folding portion 164. In an exemplary embodiment of the present invention, the first folding portion 165 and the second folding portion 164 may overlap the right side surface corner display portion 131 or the upper side surface corner display portion 132. Accordingly, the folding portions 164 and 165 may be disposed to overlap each other inwardly to form a curved surface in which the right side surface corner display portion 131 and the upper side surface corner display portion 132 are continuous with each other.

Accordingly, according to an exemplary embodiment of the present invention, the front surface display portion 110, the right side surface display portion 124, the upper side surface display portion 121, the right side surface corner display portion 131, and the upper side surface corner display portion 132 may form a display area continuous at a corner of the display panel 100. In addition, referring to FIG. 1, the through hole 151 might not be visible in the complete display panel 100. Hereinabove, the upper right corner has been described by way of example, but the remaining three corners of the display panel 100 may have a substantially identical shape. However, exemplary embodiments of the present invention are not limited thereto, and three or less corners may have a substantially identical shape.

The corners of the front surface display portion 110 may have a rounded curve, and the corner display portions 131, 132, 133, 134, 135, 136, 137, and 138 may have curved surfaces accordingly. However, exemplary embodiments of the present invention are not limited thereto. For example, the corner of the front surface display portion 110 may include one or more straight lines, and accordingly, the corner display portions 131, 132, 133, 134, 135, 136, 137, and 138 may also include one or more flat surfaces.

The display panel 100 may include a plurality of pixels displaying images. The plurality of pixels may be disposed at each of the front surface display portion 110, the side surface display portions 121, 122, 123, and 124, and the corner display portions 131, 132, 133, 134, 135, 136, 137, and 138 of the display panel 100 to display images.

Although the front surface display portion 110, the side surface display portions 121, 122, 123, and 124, and the corner display portions 131, 132, 133, 134, 135, 136, 137, and 138 have been described as separate areas according to an exemplary embodiment of the present invention, they may actually be one display area.

A pixel need not be disposed at the corner non-display portions 141, 142, 143, and 144. Referring to FIG. 2B, the display panel 100 may include an outermost non-display portion 171 which has no pixel at an outermost periphery.

However, exemplary embodiments of the present invention are not limited thereto, and a pixel may be disposed at the corner non-display portion and the outermost non-display portions 141, 142, 143, and 144 and 171.

The display panel 100 may include a flexible film, e.g., a plastic film, and may be implemented by disposing an OLED and a pixel circuit on the flexible film.

A window may be disposed on the display panel 100. The window may include a transparent hard material to transmit the image of the display panel 100 as it is and to protect the display panel 100 from external impact. In addition, the window may include a flexible film material such as a plastic film. The window may have a shape substantially identical to a shape of the display panel 100. A fastening frame supporting and fastening the display panel 100 may be provided below the display panel 100. As the display panel 100 is disposed between the window and the fastening frame, a shape of the display panel 100 may be fixed.

A process of forming the display panel according to an exemplary embodiment of the present invention will be described in more detail below with reference to FIGS. 3A, 3B, and 3C.

Figure 3A:
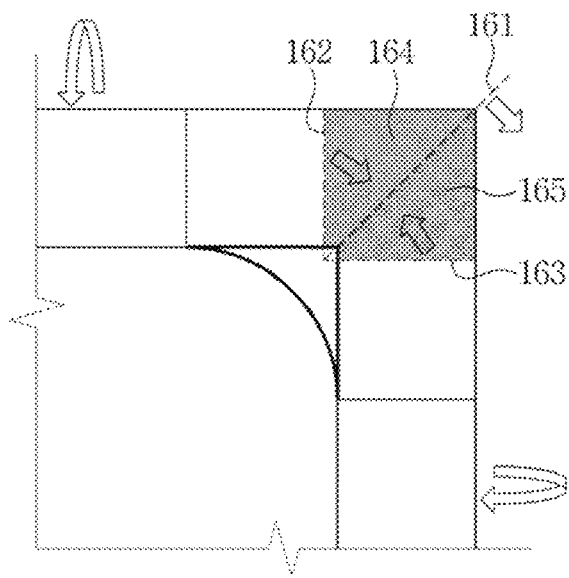
FIGS. 3A, 3B, and 3C are views illustrating a process of bending a display panel according to an exemplary embodiment of the present invention.
Figure 3B:
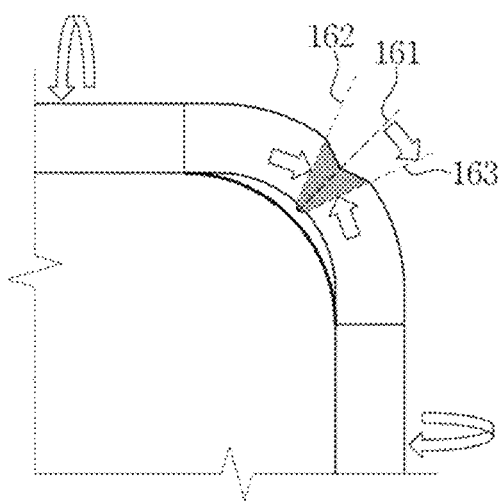
Figure 3C:
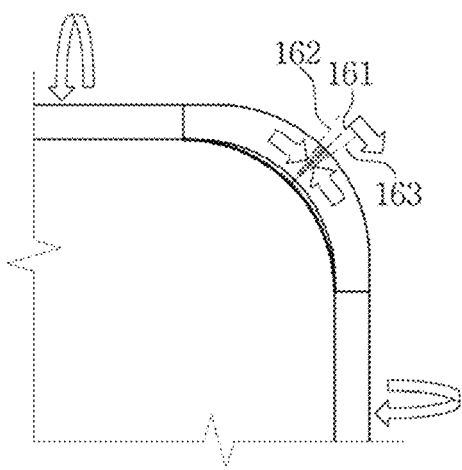

FIGS. 3A, 3B, and 3C are views illustrating a process of bending a display panel according to an exemplary embodiment of the present invention.

Referring to FIGS. 3A, 3B, and 3C, a flat flexible display panel having a shape illustrated in FIGS. 2A and 2B may be bended or folded to form the display panel 100 according to an exemplary embodiment of the present invention. Through holes 151, 152, 153, and 154 may be located at four corners of the flat display panel.

As an example, the through hole 151 on the upper right side will be described in more detail below; however, through holes 152, 153 and 154 may be substantially the same as through hole 151. The through hole 151 may be defined by a curved line at the corner portion of the front surface display portion 110, a straight line defining a boundary between the front surface display portion 110 and the upper side surface display portion 121, and a straight line defining a boundary between the front surface display portion 110 and the right side surface display portion 124, and the flat display panel may be cut along these lines.

The side surface display portions 121 and 124 may be slowly bended outwardly along the straight line defining the boundary between the front surface display portion 110 and the upper side surface display portion 121 and the straight line defining the boundary between the front surface display portion 110 and the right side surface display portion 124. Herein, with respect to the upper side of the display panel 100, a direction in which an angle between two planar surfaces increases may be defined as outwards and a direction in which an angle between two planar surfaces decreases may be defined as inwards. As an example, the corner display portions 131 and 132 and the corner non-display portion 141 may be bended outwardly along respective boundary lines 162 and 163 between the side surface corner display portions 131 and 132 and the corner non-display portion 141, and the corner non-display portion 141 or the folding portions 164 and 165 may be bended inwardly along a line 161 bisecting the corner non-display portion 141. Accordingly, the side surface corner display portions 131 and 132 may be also curved into curved surfaces.

The display panel around the remaining through holes 152, 153, and 154 may be bended at substantially a same time and in substantially a same manner as described above with reference to through hole 151.

Referring to FIGS. 3A, 3B, and 3C, when the display panel is continuously bended until the boundary lines 162 and 163 meet with each other, each of an angle between the front surface display portion 110 and each of the side surface display portions 121 and 124 and respective angles between the side surface corner display portions 131 and 132 and the corner non-display portion 141 may be about 90 degrees, the corner non-display portion 141 may be completely folded in half, and the folding portions 164 and 165 may completely overlap each other (see, e.g., FIG. 2C). The through hole 151 might not be visible from outside the complete display panel 100.

Although each angle between the front surface display portion 110 and each of the side surface display portions 121 and 124 is described as being about 90 degrees, exemplary embodiments of the present invention are not limited thereto. For example, an angle between the front surface display portion 110 and each of the side surface display portions 121, 122, 123, and 124 may be an acute angle or an obtuse angle, and accordingly, the boundary lines 162 and 163 may be oblique diagonal lines.

Figure 4A:
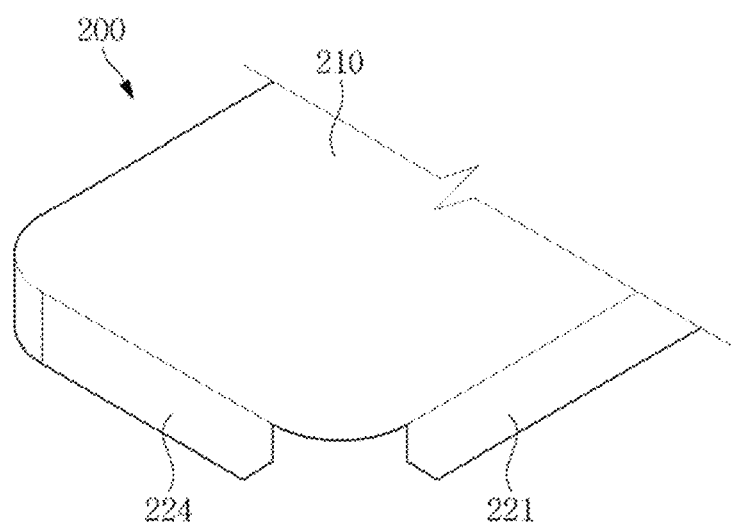
FIG. 4A is a perspective view illustrating a portion of a display panel according to an exemplary embodiment of the present invention.
Figure 4B:
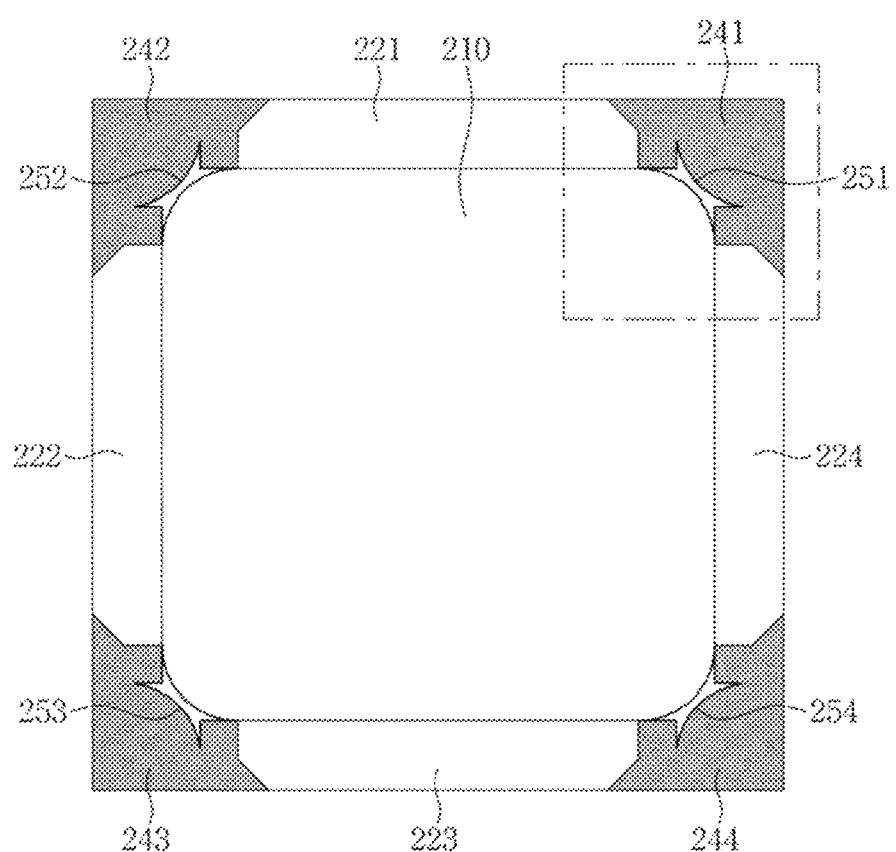
FIG. 4B is a plan view illustrating a display panel according to an exemplary embodiment of the present invention.
Figure 4C:
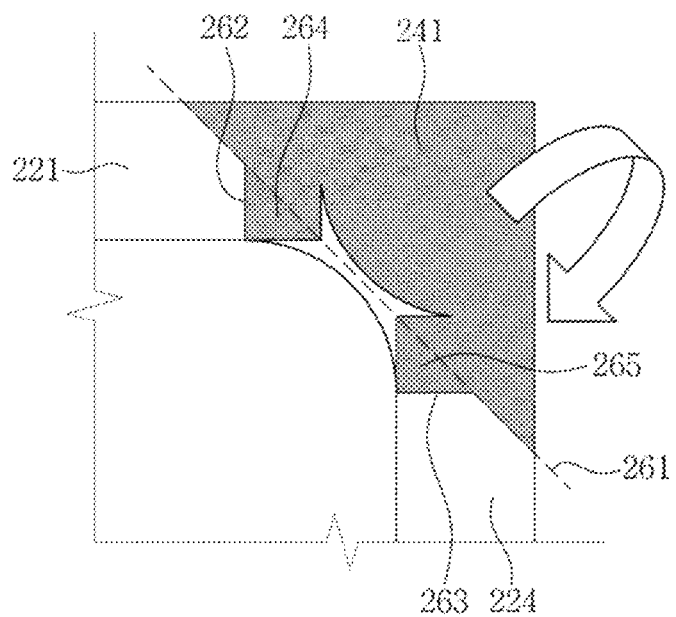
FIGS. 4C, 4D and 4E are views illustrating a process of bending a display panel according to an exemplary embodiment of the present invention.
Figure 4D:
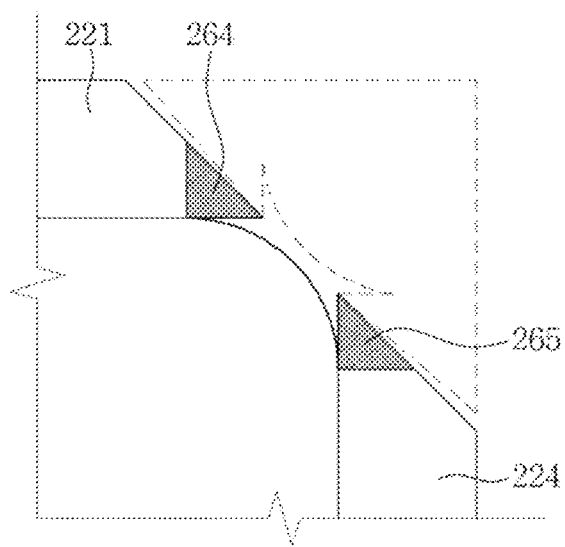
Figure 4E:
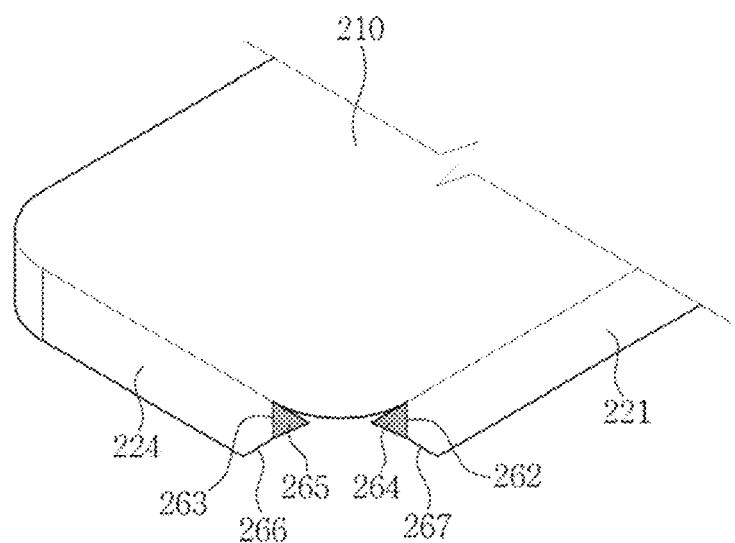

FIG. 4A is a perspective view illustrating a portion of a display panel according to an exemplary embodiment of the present invention. FIG. 4B is a plan view illustrating a display panel according to an exemplary embodiment of the present invention. FIGS. 4C, 4D and 4E are views illustrating a process of bending a display panel according to an exemplary embodiment of the present invention.

FIG. 4C is a partially enlarged view illustrating an upper right corner of a display panel according to an exemplary embodiment of the present invention.

A display panel 200 according to an exemplary embodiment of the present invention may be formed by bending or folding a flat flexible display panel. The display panel 200 may be a 3-dimensional (3D) display panel. The display panel 200 according to an exemplary embodiment of the present invention will be described in more detail below with reference to FIGS. 4A and 4C. Descriptions of components that are the same or substantially the same as those described above may be omitted below.

The display panel 200 according to an exemplary embodiment of the present invention includes a front surface display portion 210, side surface display portions 221, 222, 223, and 224 bended and extending from upper, lower, left and right sides of the front surface display portion 210, and corner non-display portions 241, 242, 243 and 244 extending from the side surface display portions 221, 222, 223, and 224.

As an example, the front surface display portion 210 includes four sides of a straight line and four corners of a curved line. A side surface display portion 221 may be bended, for example, at about 90 degrees from an upper side of the front surface display portion 210 to extend therefrom, the side surface display portion 222 may be bended, for example, at about 90 degrees from a left side of the front surface display portion 210 to extend therefrom, the side surface display portion 223 may be bended, for example, at about 90 degrees from a lower side of the front surface display portion 210 to extend therefrom, and the side surface display portion 224 may be bended, for example, at about 90 degrees from a right side of the front surface display portion 210 to extend therefrom.

The corner non-display portions 241, 242, 243, and 244 may be disposed between the side surface display portions 221, 222, 223, and 224. For example, in the case of an upper right corner, the corner non-display portion 241 may be disposed between the right side surface display portion 224 and the upper side surface display portion 221. The corner non-display portion 241 may overlap the front surface display portion 210, the right side surface display portion 224, and the upper side surface display portion 221. The corner non-display portion 241 might not be visible from outside the display panel 200.

Referring to FIGS. 4A and 4C, the display panel 200 may include a through hole 251 defined by the front surface display portion 210, the right side surface display portion 224, the upper side surface display portion 221, and the corner non-display portion 241. The through hole 251 may be a hole which passes through the display panel 200 in an up and down direction (e.g., a direction orthogonal to the front surface display panel 210).

The side surface display portion 224 may include a side 263 substantially perpendicular to a boundary line between the side surface display portion 224 and the front surface display portion 210 and a side 266 (see, e.g., FIG. 4E) forming an angle of about 45 degrees with respect to the boundary between the right side surface display portion 224 and the front surface display portion 210. The side surface display portion 221 includes a side 262 perpendicular to a boundary line between the side surface display portion 221 and the front surface display portion 210 and a side 267 (see FIG. 4E) forming an angle of about 45 degrees with respect to the boundary between the right side surface display portion 221 and the front surface display portion 210. Thus, one portion of the side surface display portion 224 may include the two sides 263 and 266 forming an interior angle which is obtuse, for example, about 135 degrees. Additionally, one portion of the side surface display portion 221 includes the two sides 262 and 267 forming an interior angle which is obtuse, for example, about 135 degrees.

Thus, according to an exemplary embodiment of the present invention, the display panel 200 may include the side surface display portions 221, 222, 223, and 224, each having a hexagonal shape, diagonal corners that are opposite to the front surface display portion, and corners between the side surface display portions 221, 222, 223, and 224 that are open. Although the upper right corner has been described above by way of example, the remaining three corners may have a substantially identical shape. However, exemplary embodiments of the present invention are not limited thereto, and three or less corners may have a substantially identical shape.

The corners of the front surface display portion 210 may have curved shapes but exemplary embodiments of the present invention are not limited thereto.

A process of forming the display panel 200 according to an exemplary embodiment of the present invention will be described in more detail below with reference to FIGS. 4C, 4D, and 4E.

Referring to FIGS. 4C, 4D, and 4E, a flat flexible display panel having a shape illustrated in FIG. 4B may be bended or folded to form the display panel 200 according to an exemplary embodiment of the present invention. Through holes 251, 252, 253, and 254 may be located at four corners of the flat display panel.

As an example, the through hole 251 on the upper right side will be described in more detail below; however through holes 252, 253 and 254 may be substantially the same as through hole 251. The through hole 251 may include a first area defined by a curved line at a corner portion of the front surface display portion 210, a first straight line defining a boundary between the front surface display portion 210 and the upper side surface display portion 221, a second straight line defining a boundary between the front surface display portion 210 and the right side surface display portion 224, and a folding line 261 adjacent to the curved line at the corner portion of the front surface display portion 210, and a second area symmetric to the first area with respect to the folding line 261. The first area and the second area of the flat display panel may be cut. The folding line 261 may be located between a point at which the first straight line and the second straight line meet each other and the curved line at the corner portion of the front surface display portion 210.

When the corner non-display portion 241 is completely folded outwardly along the folding line 261, the corner non-display portion 241 outside the folding line 261 might not be visible (see, e.g., FIG. 4D), and the corner of the front surface display portion 210 may be exposed.

Referring to FIG. 4E, the side surface display portions 221 and 224 may be bended outwardly along the straight line which defines the boundary between the front surface display portion 210 and the upper side surface display portion 221 and the straight line which defines the boundary between the front surface display portion 210 and the right side surface display portion 224. The display panel around the remaining through holes 252, 253, and 254 may also be bended in the above-described manner.

When the non-display portions 264 and 265 remaining inside the folding line 261 (see, e.g., FIG. 4E) are completely folded outwardly to overlap the side surface display portions 221 and 224, the display panel illustrated in FIG. 4A may be formed.

FIGS. 5A, 5B, 5C, 5D, and 5E are views illustrating examples of shapes of through holes according to an exemplary embodiment of the present invention.

Figure 5A:
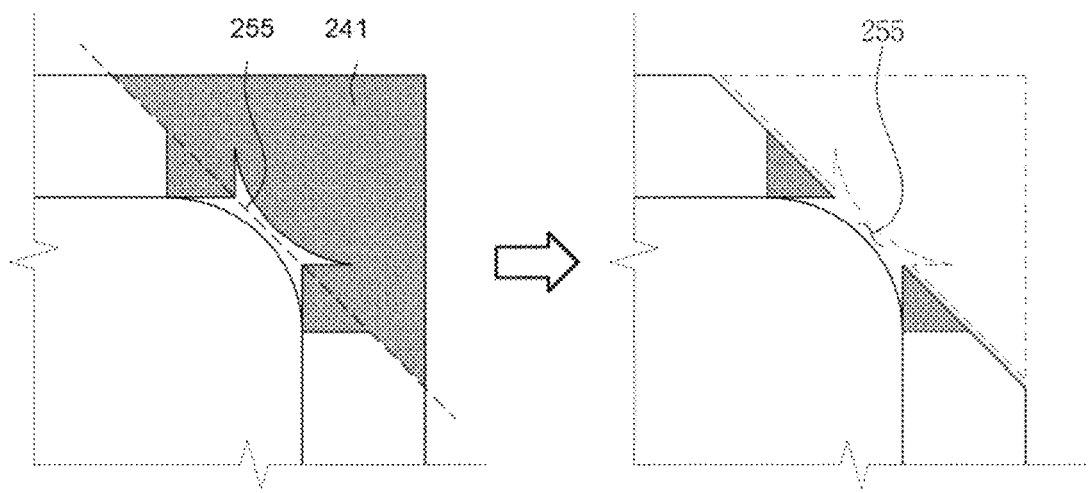
FIGS. 5A, 5B, 5C, 5D, and 5E are views illustrating examples of shapes of through holes according to an exemplary embodiment of the present invention.

Referring to FIGS. 5A, 5B, 5C, 5D, and 5E, through holes 255, 256, 257, 258, 259, 271, 272, 273 and 274 may have various shapes. Referring to FIG. 5A, a through hole 255 may include a first area defined by a curved line at a corner portion of the front surface display portion 210, a first straight line defining a boundary between the front surface display portion 210 and the upper side surface display portion 221, a second straight line defining a boundary between the front surface display portion 210 and the right side surface display portion 224, and a folding line 261 adjacent to the curved line at the corner portion of the front surface display portion 210, and a second area symmetric to the first area with respect to the folding line 261.

Figure 5B:
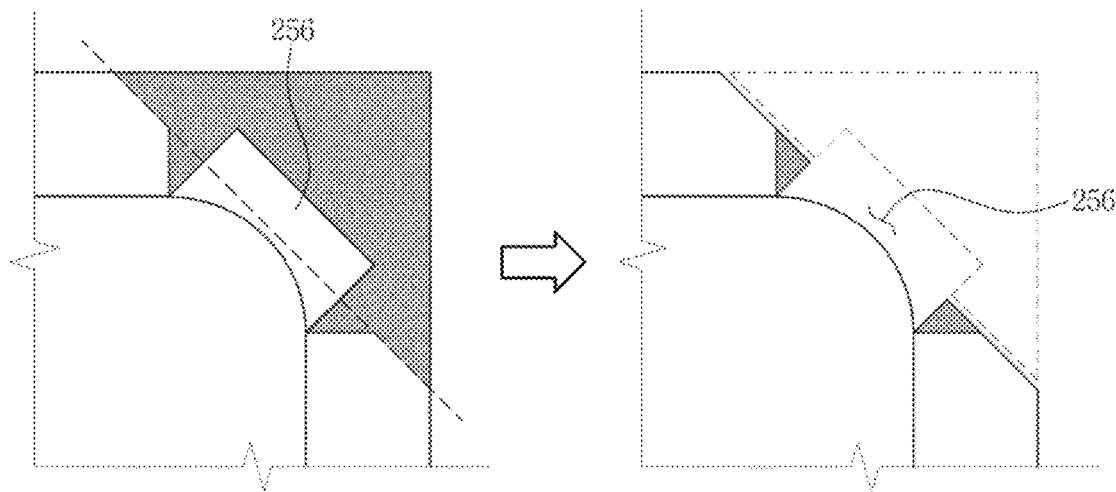
Figure 5C:
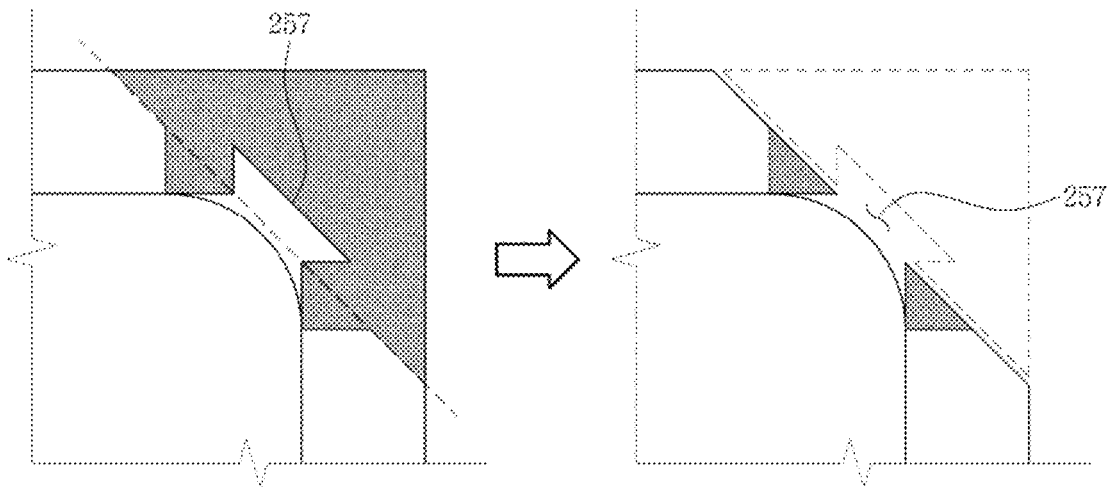
Figure 5D:
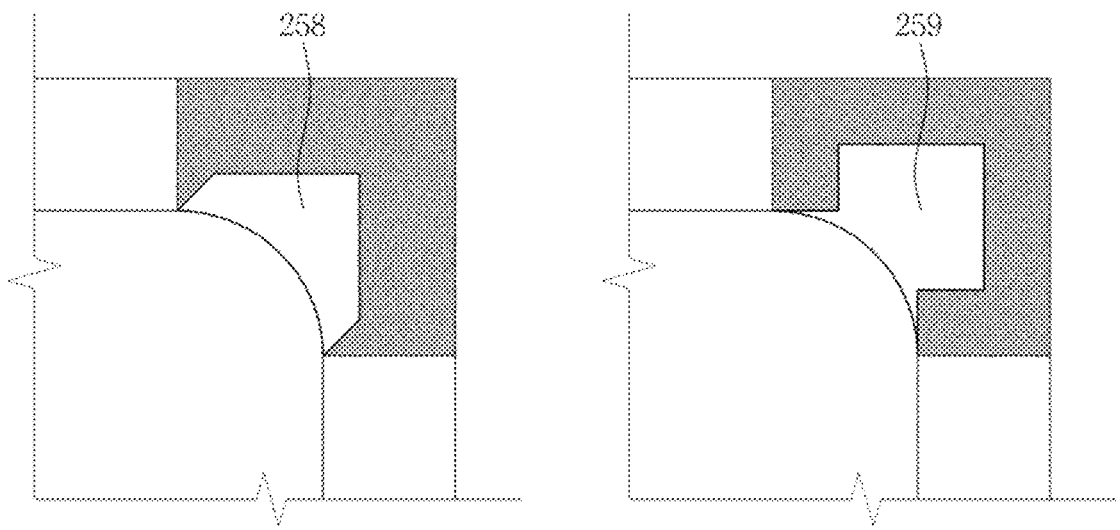

However, exemplary embodiments of the present invention are not limited to the shape of the through hole as defined above. Referring to FIGS. 5B, 5C, for example, another shape of through holes is applicable in which all of corners of a front surface display portion 210 are exposed and a corner non-display portion 241 folded backwardly will not be visible, when the corner non-display portion 241 is folded.

Figure 5E:
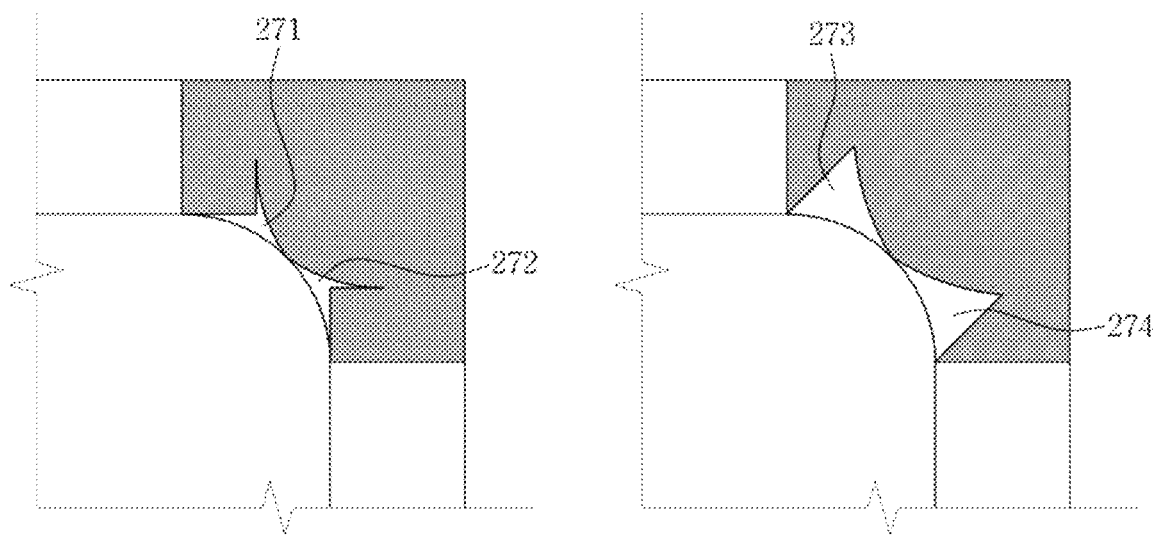

Alternatively, referring to FIG. 5E, a folding line 261 may contact a front surface display portion 210, such that the front surface display portion 210 and a non-display portion 241 may be connected to each other at a single point to define two through holes.

Figure 6A:
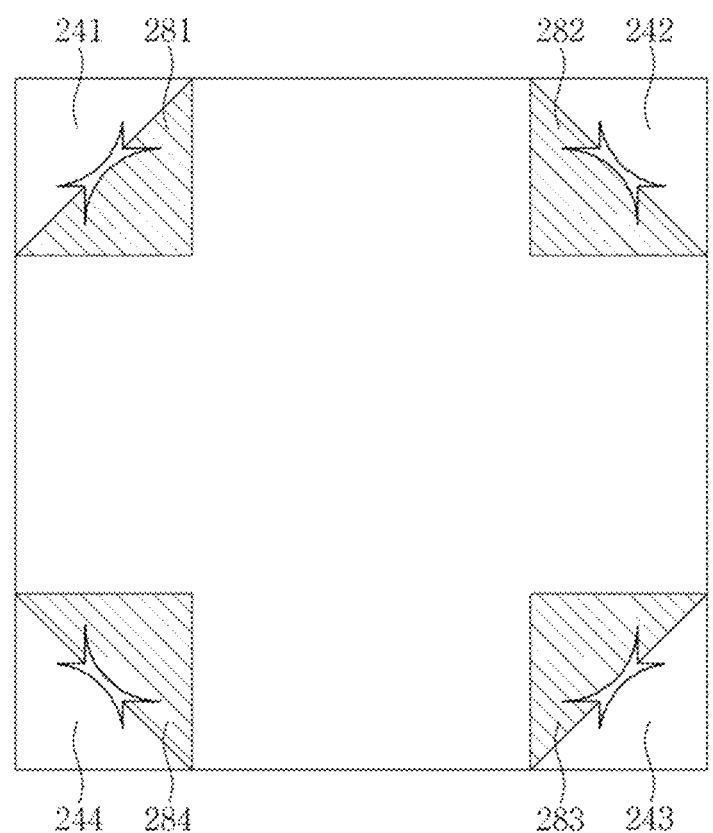
FIG. 6A is a plan view illustrating a display panel including a buffer film attached to a back surface of a display panel according to an exemplary embodiment of the present invention.
Figure 6B:
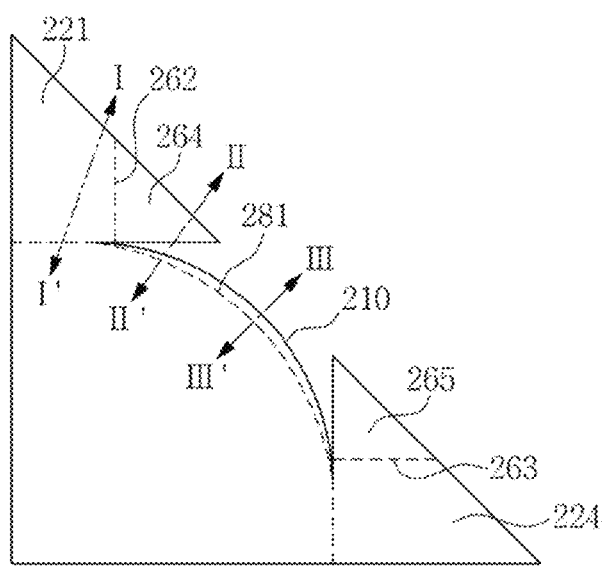
FIG. 6B is a plan view illustrating arrangement of a buffer film according to an exemplary embodiment of the present invention.
Figure 6C:
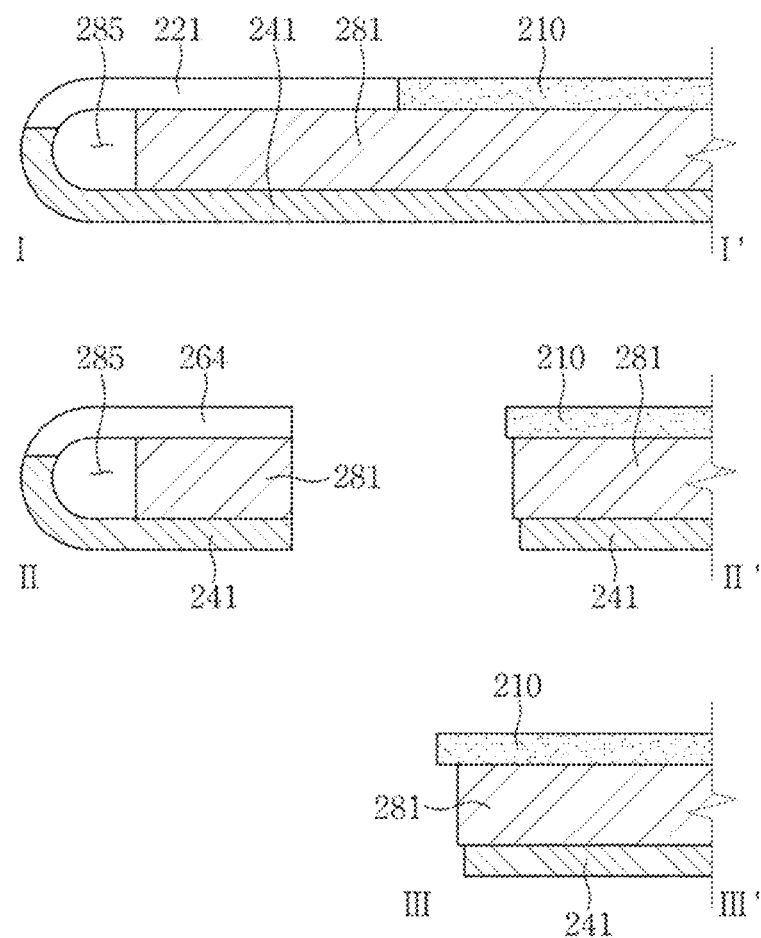
FIG. 6C is a cross-sectional view illustrating arrangement of a buffer film according to an exemplary embodiment of the present invention.

FIG. 6A is a plan view illustrating a display panel including a buffer film attached to a back surface of a display panel according to an exemplary embodiment of the present invention. FIG. 6B is a plan view illustrating arrangement of a buffer film according to an exemplary embodiment of the present invention. FIG. 6C is a cross-sectional view illustrating arrangement of a buffer film according to an exemplary embodiment of the present invention.

Referring to FIG. 6A, buffer films 281, 282, 283, and 284 are disposed at overlapping portions where corner non-display portions 241, 242, 243, and 244 are folded. For example, referring to FIGS. 6B and 6C, the buffer film 281 may be disposed between the corner non-display portion 241 which is folded; and a front surface display portion 210, side surface display portions 221 and 224, and the corner non-display portion 241 (e.g., 264 and 265 in FIG. 6C). The buffer film 281 may have a predetermined distance from the display panel near the folding line 261 so that an empty space 285 between the folded portion of the display panel and the buffer film 281 may be formed and the display panel folded at the folding line 261 may have a predetermined curvature. The buffer film may have a thickness and a hardness so that the buffer film may absorb shock that may be applied to the display panel when the display panel is folded to overlap itself and the display panel may bend with a predetermined curvature.

Figure 7A:
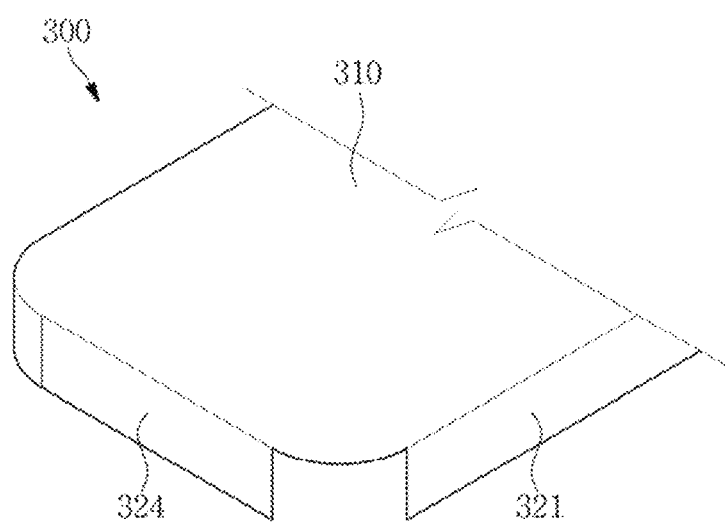
FIG. 7A is a perspective view illustrating a display panel according to an exemplary embodiment of the present invention.
Figure 7B:
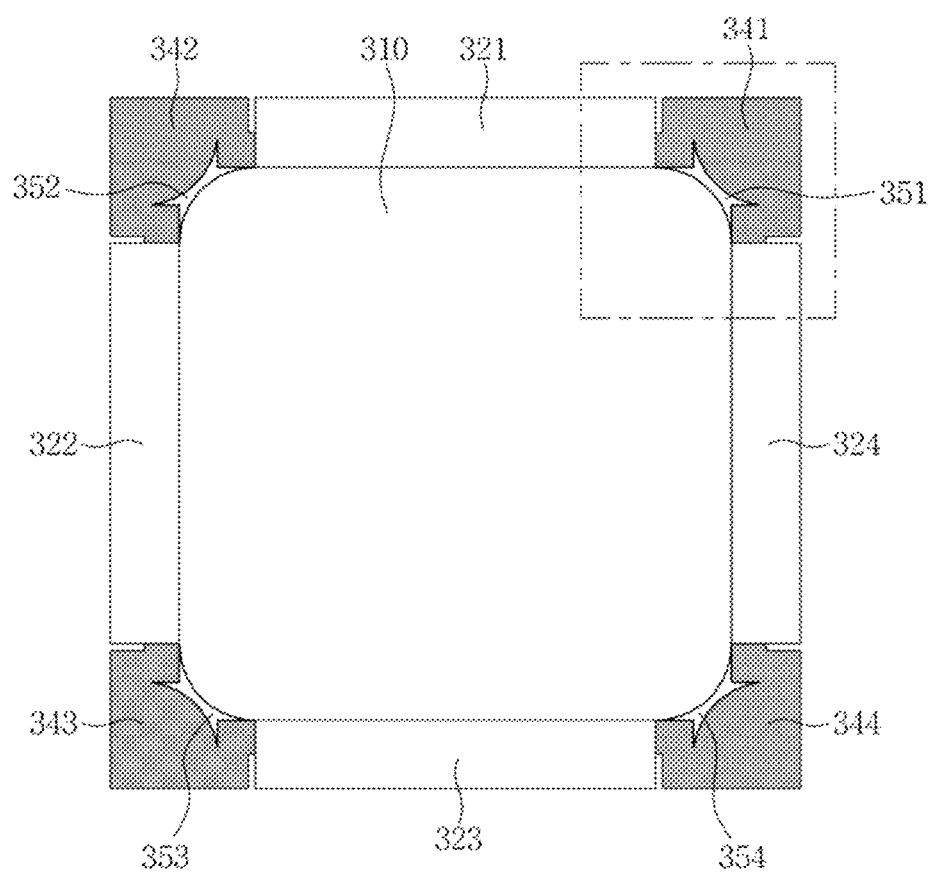
FIG. 7B is exploded plan view illustrating a display panel according to an exemplary embodiment of the present invention.

FIG. 7A is a perspective view illustrating a display panel according to an exemplary embodiment of the present invention. FIG. 7B is a plan view illustrating a display panel according to an exemplary embodiment of the present invention.

A display panel 300 according to an exemplary embodiment of the present invention will be described in more detail below with reference to FIGS. 7A and 7B. Descriptions of components that are the same or substantially the same as those described above may be omitted below.

As in an exemplary embodiment of the present invention described above with reference to FIGS. 4A, 4B, and 4C, a display panel 300 according to an exemplary embodiment of the present invention may include a front surface display portion 310, side surface display portions 321, 322, 323, and 324 bended and extending from upper, lower, left and right sides of the front surface display portion 310, and corner non-display portions 341, 342, 343 and 344 extending from the side surface display portions 321, 322, 323, and 324. The display panel 300 may be a 3-dimensional (3D) display panel.

The corner non-display portions 341, 342, 343, and 344 may be disposed between the side surface display portions 321, 322, 323, and 324, and may overlap the front surface display portion 310 and the side surface display portions 321 and 324. Thus, the corner non-display portions 341, 342, 343, and 344 might not be visible from outside the display panel 300.

The display panel 300 may include though holes 351, 352, 353 and 354 defined by the front surface display portion 310, the side surface display portions 321 and 324, and the corner non-display portion 341.

However, a part of each boundary between the side surface display portions 321, 322, 323, and 324 and the corner non-display portions 341, 342, 342, and 344 may be cut, and one portion of the side surface display portion 324 may have a side perpendicular to a boundary between the side surface display portion 324 and the front surface display portion 310.

Accordingly, according to an exemplary embodiment of the present invention, the display panel 200 may be provided in which corners between the side surface display portions 321, 322, 323, and 324, each having a quadrangular shape, are open.

A process of forming the display panel 300 according to an exemplary embodiment of the present invention will be described in more detail below with reference to FIGS. 7C, 7D, and 7E. Descriptions of components that are the same or substantially the same as those described above may be omitted below.

Figure 7C:
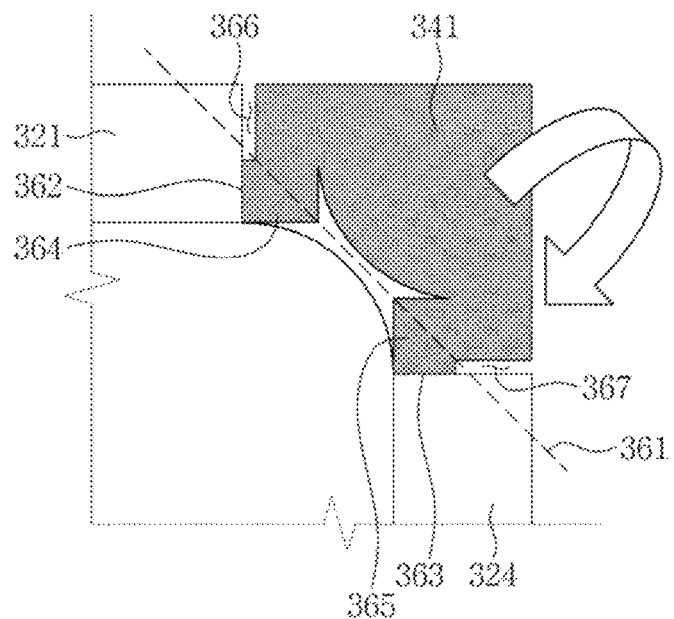
FIGS. 7C, 7D, and 7E are views illustrating a process of bending a display panel according to an exemplary embodiment of the present invention.
Figure 7D:
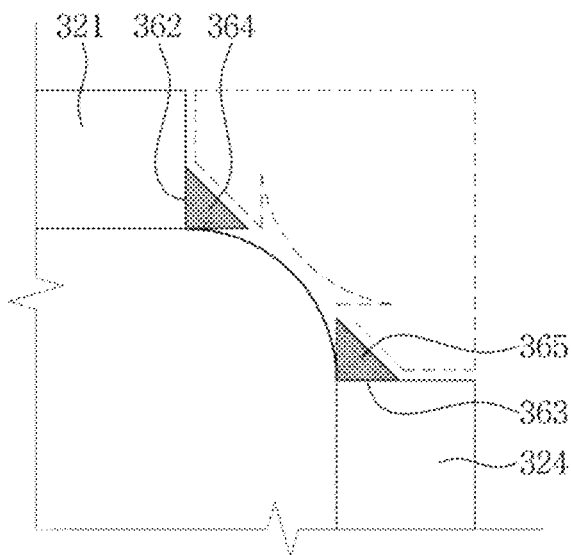
Figure 7E:
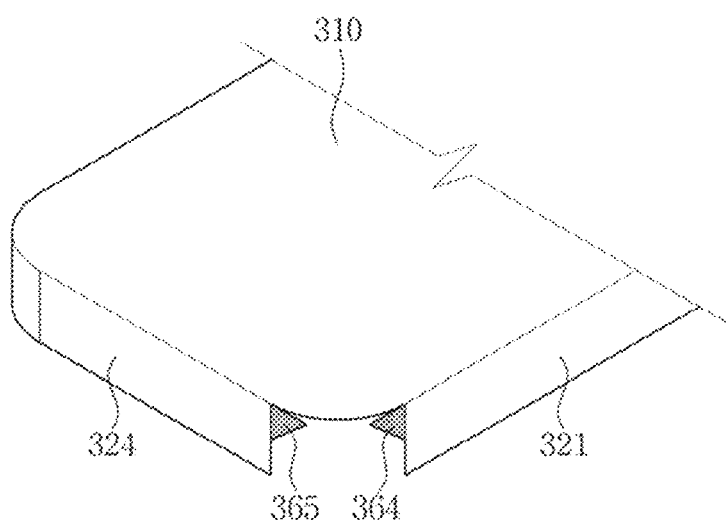

FIGS. 7C, 7D, and 7E are views illustrating a process of bending a display panel according to an exemplary embodiment of the present invention.

Referring to FIG. 7C, in the display panel 300, the corner non-display portion 341 may be disposed between the side surface display portion 321 and the side surface display portion 324, each having a quadrangular shape. In addition, the display panel 300 may include cut portions 366 and 367 in which a part of each boundary line 362 and 363 between the corner non-display portion 341 and the side surface display portions 321 and 324, for example, a boundary line outside a folding line 361, is cut.

When the corner non-display portion 341 is completely folded outwardly along the folding line 361, the corner of the front surface display portion 310 and the cut portions 366 and 367 of the side surface display portion may be exposed.

Referring to FIG. 7E, the side surface display portions 321 and 324 may be bended outwardly along the straight line defining the boundary between the front surface display portion 310 and the upper side surface display portion 321 and a straight line defining the boundary between the front surface display portion 310 and the right side surface display portion 324. The display panel around the remaining through holes 352, 353, and 354 may also be bended in the above-described manner.

When non-display portions 364 and 365 remaining inside the folding line 261 (see, e.g., FIG. 7E) are completely folded outwardly to overlap the side surface display portions 221 and 224, respectively, the display panel illustrated in FIG. 7A is provided.

FIGS. 8, 9, 10, 11, 12, and 13 are wiring diagrams illustrating a display panel according to an exemplary embodiment of the present invention. A bypass wiring that bypasses a through hole will be described in more detail below with reference to FIGS. 8, 9, 10, 11, 12, and 13.

Figure 8:
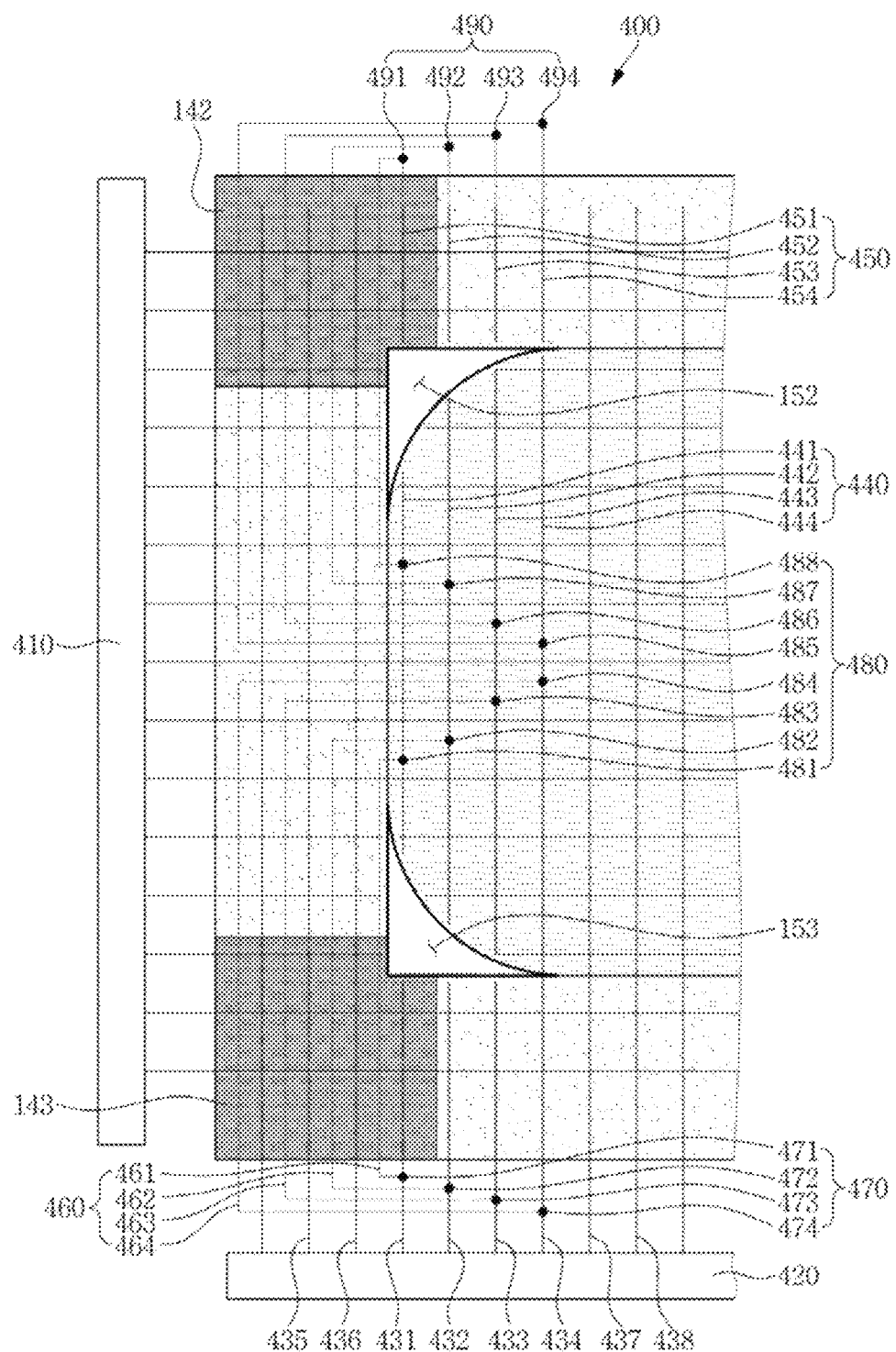
FIGS. 8, 9, 10, 11, 12, and 13 are wiring diagrams illustrating a display panel according to an exemplary embodiment of the present invention.

Referring to FIG. 8, a display device 400 according to an exemplary embodiment of the present invention may include the display panel 100, a gate driver 410, and a data driver 420. The display device 400 may include a light emission control driver, and/or a power supply portion.

The display panel 400 may include gate lines, data lines, and pixels connected to each of the gate line and the data line. The gate lines may be arranged along a longitudinal direction, and each of the gate lines extends along a transverse direction. The data lines may be arranged along the transverse direction, and each of the data lines may extend along the longitudinal direction.

The gate driver 410 may generate gate signals in accordance with a gate control signal provided from a timing controller, and may sequentially supply the gate signals to the plurality of gate lines.

The data driver 420 may supply data voltages to the data lines, respectively. For example, the data driver 420 may receive image data signals and data control signals from a timing controller. The data driver 420 may sample image data signals according to a data control signal, may sequentially latch sampling image data signals corresponding to one horizontal line in each horizontal period, and may output the latched image data signals to the data lines substantially simultaneously.

Pixels may be arranged in the display panel 100 in the form of a matrix. The pixels may be disposed in a display area of the display panel 100. These pixels emit light of colors different from each other.

The display panel 100 may include the through holes 151, 152, 153 and 154 disposed at corners of the display panel. Accordingly, referring to FIG. 8, the data lines arranged in a direction that crosses the through holes may be each divided into three lines by the plurality of through holes 152 and 153. For example, the data lines in a direction that crosses the through holes may include first divided lines 431, 432, 433, and 434 each including one end directly connected to the data driver 420 and another end cut by the through hole 153, second divided lines 440 (e.g., second divided lines 441, 442, 443, and 444) each including opposite ends cut by the through holes 152 and 153, and third divided lines 450 (e.g., third divided lines 451, 452, 453, and 454) each including one end cut by the through hole 152 and another end extending in a direction opposite to the data driver 420. In an exemplary embodiment of the present invention, other data lines 435, 436, 437, and 438 are not divided by the through hole. The first and second divided lines 430 and 440 described herein may be data lines.

Referring to FIG. 8, bypass wirings 460 (e.g., bypass wirings 461, 462, 463 and 464) may connect the first divided lines 431, 432, 433, and 434 to second divided lines 440, respectively. For example, bypass wirings 461, 462, 463, and 464 may be spaced apart from corresponding ones of the data lines with an insulating layer therebetween, may be connected to the first divided lines 431, 432, 433, and 434 through contact holes 470 (e.g., contact holes 471, 472, 473, and 474), respectively, and may be connected to the second divided lines 441, 442, 443, and 444 through contact holes 480 (e.g., contact holes 481, 482, 483, and 484), respectively. Accordingly, the first divided lines 431, 432, 433, and 434 and the second divided lines 441, 442, 443, and 444 may be connected to each other through the bypass wirings 461, 462, 463, and 464, and the data signal may be applied to the second divided lines 441, 442, 443, and 444.

Similarly, other bypass wirings may connect the second divided lines 441, 442, 443, and 444 to the third divided lines 451, 452, 453, and 454, respectively. Accordingly, the second divided lines 441, 442, 443, and 444 and the third divided lines 451, 452, 453, and 454 may be connected to each other through the bypass wirings, respectively, and the data signal may be applied to the third divided lines 451, 452, 453, and 454.

For example, the bypass wirings 460 may extend in the transverse direction along the outermost non-display portion 171 from the position of contact holes 470 located at the outermost non-display portion 171, may extend in the longitudinal direction along the corner non-display portion 143 and the side surface display portion 122, and may extend in the transverse direction to the contact holes 481, 482, 483, and 484 located at the front surface display portion 110.

Similarly, other bypass wirings may extend in the transverse direction along the outermost non-display portion 171 from the position of contact holes 490 (e.g., contact holes 491, 492, 493 and 494) located at the outermost non-display portion 171, may extend in the longitudinal direction along the corner non-display portion 142 and the side surface display portion 122, and may extend in the transverse direction to contact holes 480 (e.g., contact holes 485, 486, 487, and 488) located at the front surface display portion 110.

In an exemplary embodiment of the present invention, although the bypass wirings may extend in the longitudinal direction along the side surface display portion 122, exemplary embodiments of the present invention are not limited thereto. The bypass wirings may extend in the longitudinal direction along the outermost non-display portion 171 adjacent to the side surface display portion 121 (see, e.g., FIG. 2B).

Although the contact holes 460 and 490 may be located at the outermost non-display portion 171, exemplary embodiments of the present invention are not limited thereto. For example, the contact holes 460 and 490 may be located at the side surface display portions 121, 122, 123, 124, and the bypass wiring may only be located at the front surface display portion 110, the side surface display portions 121, 122, 123, 124, and the corner non-display portions 141, 142, 143, and 144.

Although the bypass wirings 460 may extend in the transverse and longitudinal directions, exemplary embodiments of the present invention are not limited thereto. For example, the bypass wirings 460 may have a shape of an oblique straight line, or a curved line. In addition, the bypass wirings 460 may be curved in a shape similar to that of the through holes 151, 152, 153, and 154.

Although the first divided lines 431, 432, 433, and 434 and the second divided lines 440 may be connected to each other with the bypass wirings 460, respectively, and the second divided lines 440 and third divided lines 450 may be connected to each other with another bypass wirings, respectively, exemplary embodiments of the present invention are not limited thereto. The first divided lines 431, 432, 433, and 434 and the second divided lines 440 may be connected to each other with the bypass wirings 460, respectively, and the first divided lines 431, 432, 433, and 434 and the third divided lines 450 may be connected to each other by another bypass wirings, respectively.

Figure 9:
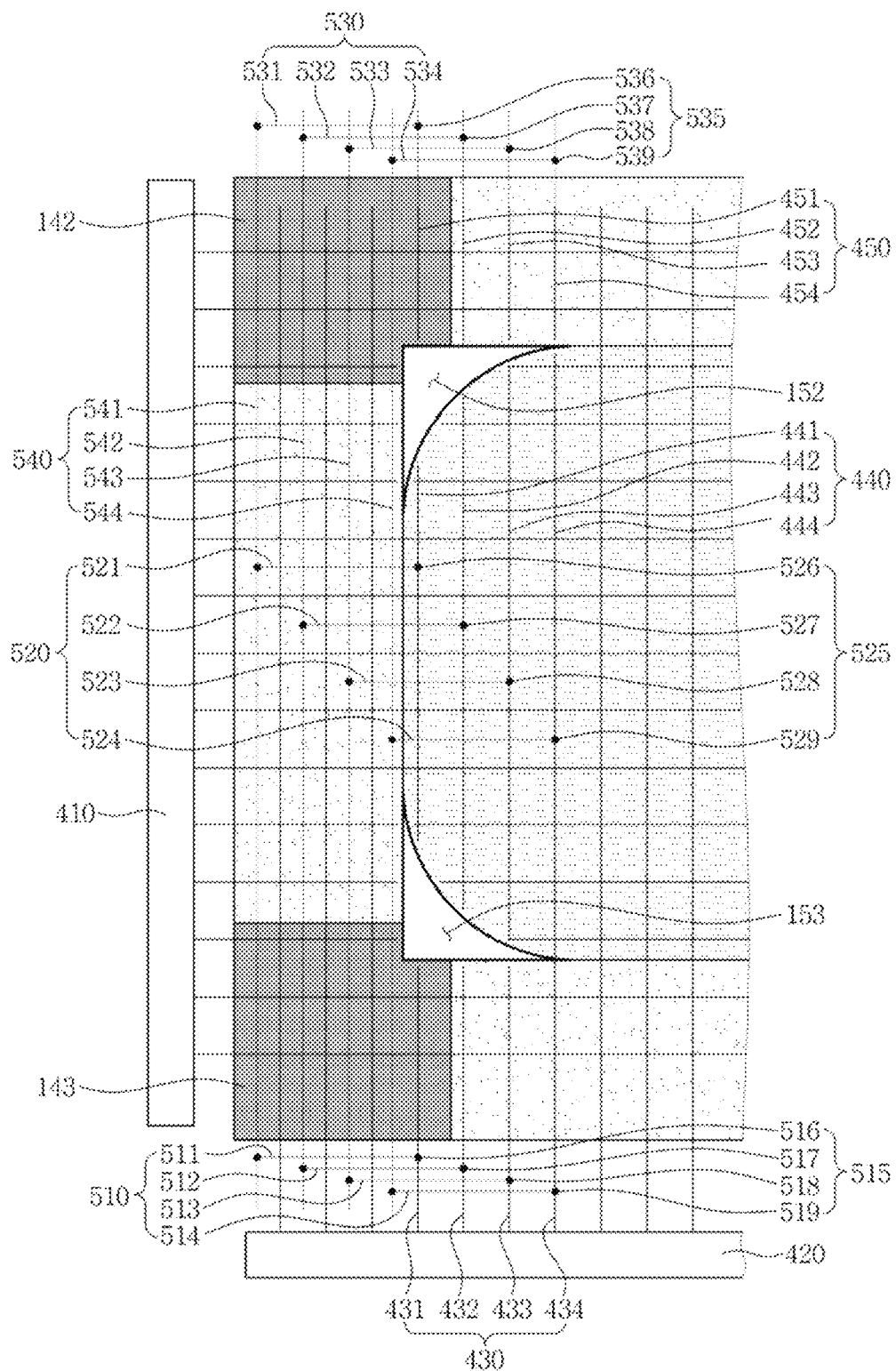

FIG. 9 is a bypass wiring diagram according to an exemplary embodiment of the present invention.

Referring to FIG. 9, the bypass wirings include bypass wirings 540 (e.g., bypass wirings 541, 542, 543 and 544) in the longitudinal direction parallel to the data lines, and bypass wirings 510 (e.g., bypass wirings 511, 512, 513 and 514), 520 (e.g., bypass wirings 521, 522, 523 and 524), and 530 (e.g., bypass wirings 531, 532, 533 and 534) in the transverse direction. The bypass wirings 540 in the longitudinal direction may be formed on a pattern layer on which wirings in the longitudinal direction are formed, e.g., a layer on which the data line is formed. The bypass wiring 510, 520, and 530 in the transverse direction may be formed on a pattern layer on which wirings in the transverse direction are formed, e.g., a layer on which the gate line is formed.

The bypass wirings 540 in the longitudinal direction may extend to the outermost non-display portion 171. Each of the bypass wirings 510 in the transverse direction may include one end connected to each corresponding one of first divided lines 430 (e.g., first divided lines 431, 432, 433, and 434) through contact holes 515 (e.g., contact holes 516, 517, 518 and 519), respectively; and another end connected to each corresponding one of the bypass wirings 540 in the longitudinal direction through contact holes, respectively. Each of the bypass wirings 520 in the transverse direction may include one end connected to each corresponding one of second divided lines 440 through contact holes 525 (e.g., contact holes 526, 527, 528 and 529), respectively; and another end connected to each corresponding one of the bypass wirings 540 in the longitudinal direction through contact holes, respectively. Each of the bypass wirings 530 in the transverse direction may include one end connected to each corresponding one of third divided lines 450 through contact holes 535 (e.g., contact holes 536, 537, 538 and 539), respectively; and another end connected to each corresponding one of the bypass wirings 540 in the longitudinal direction through contact holes positioned at a junction between the bypass wirings 530 and the bypass wirings 540, respectively.

Accordingly, the first divided lines 431, 432, 433, and 434, the second divided line 440, and the third divided lines 450 may be connected to each other by the bypass wirings 510, 520, and 530 in the transverse direction and the bypass wirings 540 in the longitudinal direction, respectively, and the data signal may be applied thereto.

Although the bypass wirings 540 in the longitudinal direction may extend in the longitudinal direction along the side surface display portion 122, exemplary embodiments of the present invention are not limited thereto. The bypass wirings 540 in the longitudinal direction may extend in the longitudinal direction along the outermost non-display portion 171 adjacent to the side surface display portion 122.

Although the contact holes 515 and 535 may be located at the outermost non-display portion 171, exemplary embodiments of the present invention are not limited thereto. For example, the contact holes 515 and 535 may be located at the side surface display portions 121, 122, 123, 124, or the corner display portions 131, 132, 133, 134, 135, 136, 137, and 138. The bypass wirings 510 and 530 in the transverse direction may be disposed at the front surface display portion 110, the side surface display portions 121, 122, 123, 124, the corner display portions 131, 132, 133, 134, 135, 136, 137, and 138, or the corner non-display portions 141, 142, 143, and 144 (see, e.g., FIG. 2A).

Figure 10:
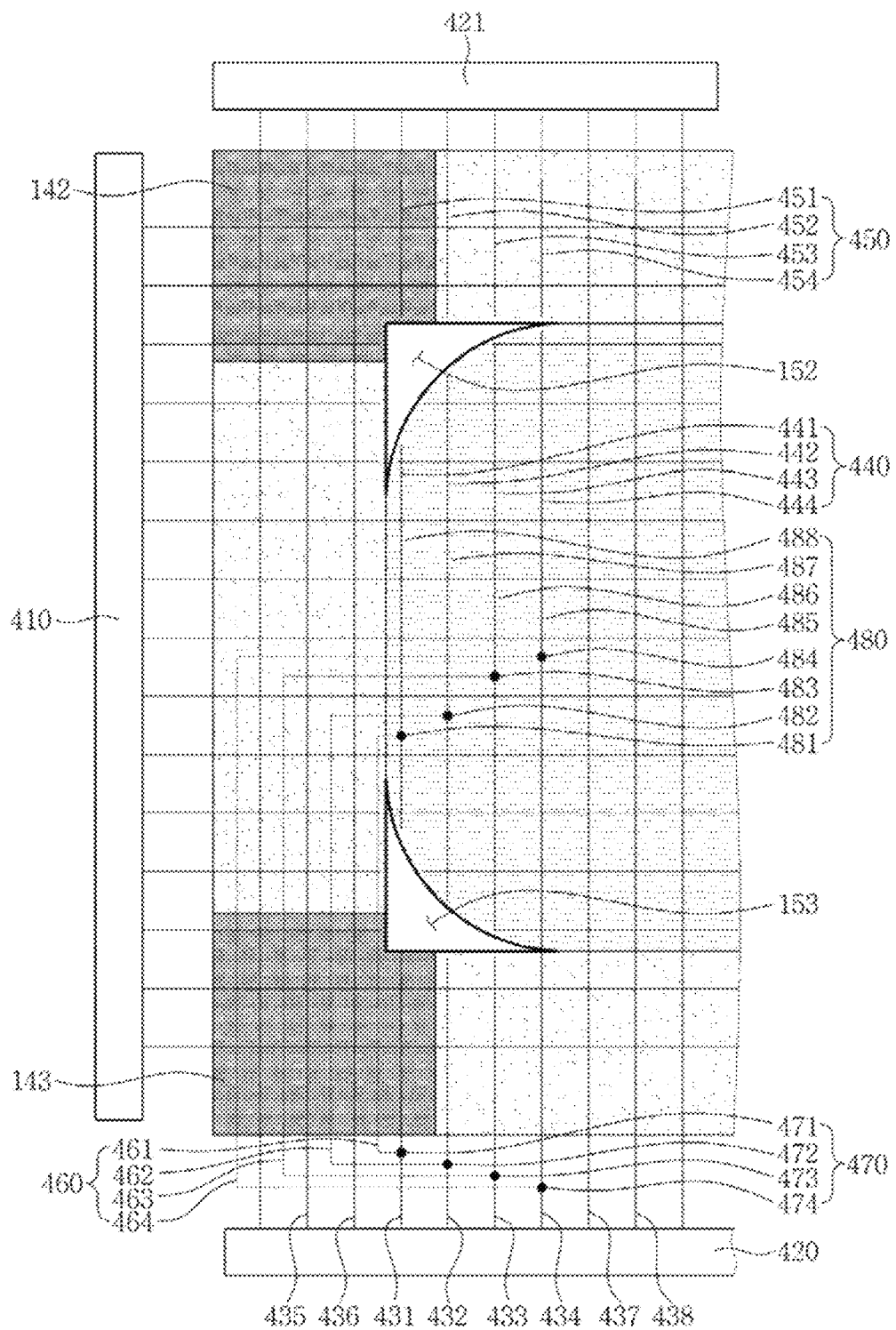

FIG. 10 is a bypass wiring diagram according to an exemplary embodiment of the present invention.

Referring to FIG. 10, data drivers 420 and 421 may be disposed on opposite sides of a display panel. Accordingly, the data driver 420 may supply a data signal to first divided lines 430, and the data driver 421 may supply a data signal to third divided lines 450. Second divided lines 440 may be connected to at least one of the first divided lines 430 and the third divided lines 450 according to an exemplary embodiment of the present invention described above.

Figure 11:
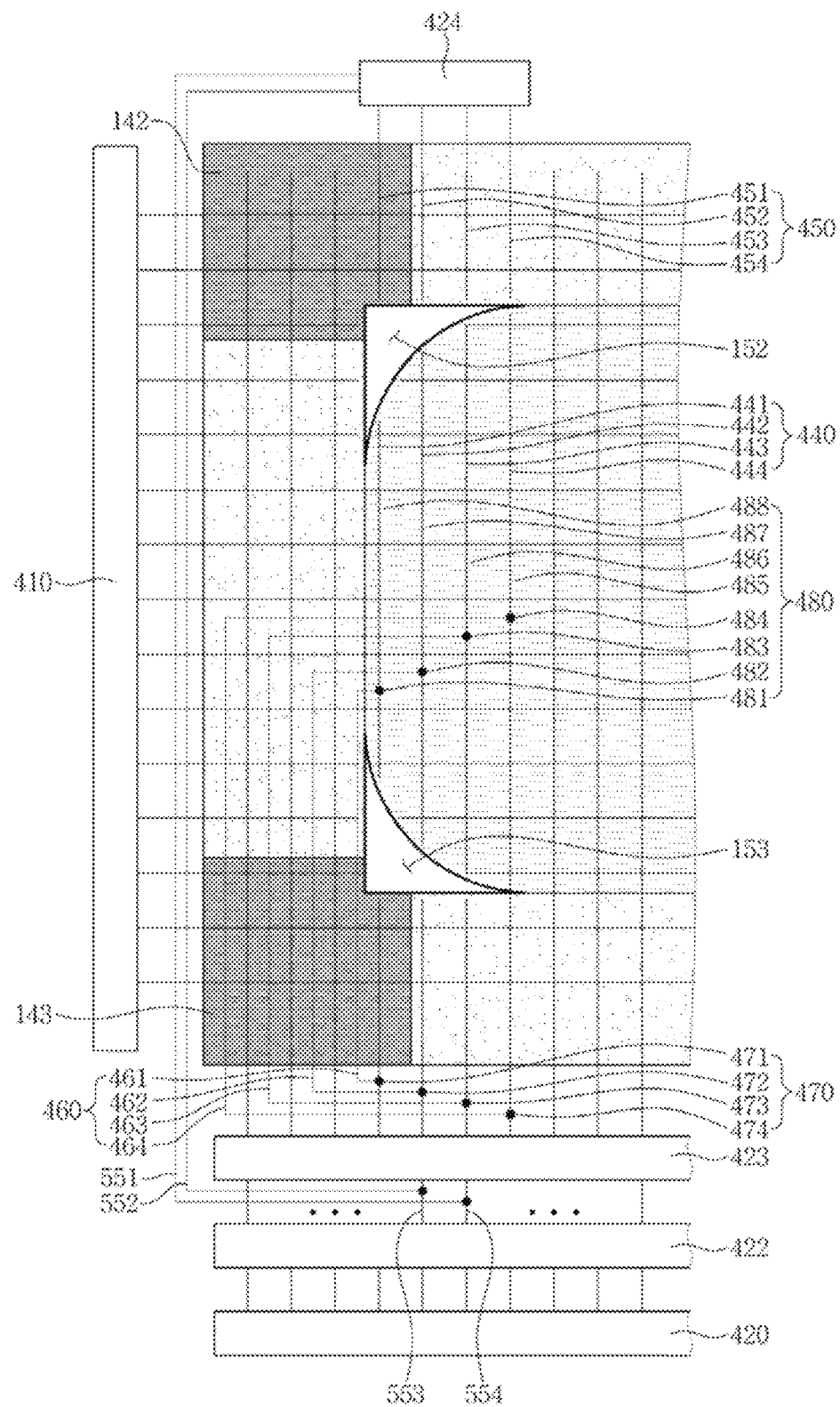

FIG. 11 is a bypass wiring diagram according to an exemplary embodiment of the present invention.

Referring to FIG. 11, a multiplexer 422 may be disposed on one side of a display panel, and demultiplexers 423 and 424 may be disposed on opposite sides of the display panel. A data signal output from a data driver (e.g., data driver 420) may be input to the multiplexer 422, and all signals output from the multiplexer 422 may be input to the demultiplexer 423 (e.g., through wirings 553 and 554 connecting the multiplexer 422 to the demultiplexer 423). A signal corresponding to a signal to be supplied to divided data lines among signals output from the multiplexer 422 may be supplied to the demultiplexer 424 through bypass wirings 551 and 552. The second divided lines 440 may be connected to at least one of the first divided lines 430 (see, e.g., first divided lines 431, 432, 433 and 434 in FIG. 9) and the third divided line 450 according to an exemplary embodiment of the present invention described above.

Accordingly, the demultiplexer 423 may apply the data signal to the first divided lines 430 (see, e.g., first divided lines 431, 432, 433 and 434 in FIG. 9) and the demultiplexer 424 may apply the data signal to the third divided lines 450. If there are four data lines 431 to 444 to be bypassed, two bypass wirings (e.g., bypass wirings 551 and 552) may be used. Accordingly, the number of bypass wirings may be reduced by using the multiplexer 422 and the demultiplexers 423 and 424.

Figure 12:
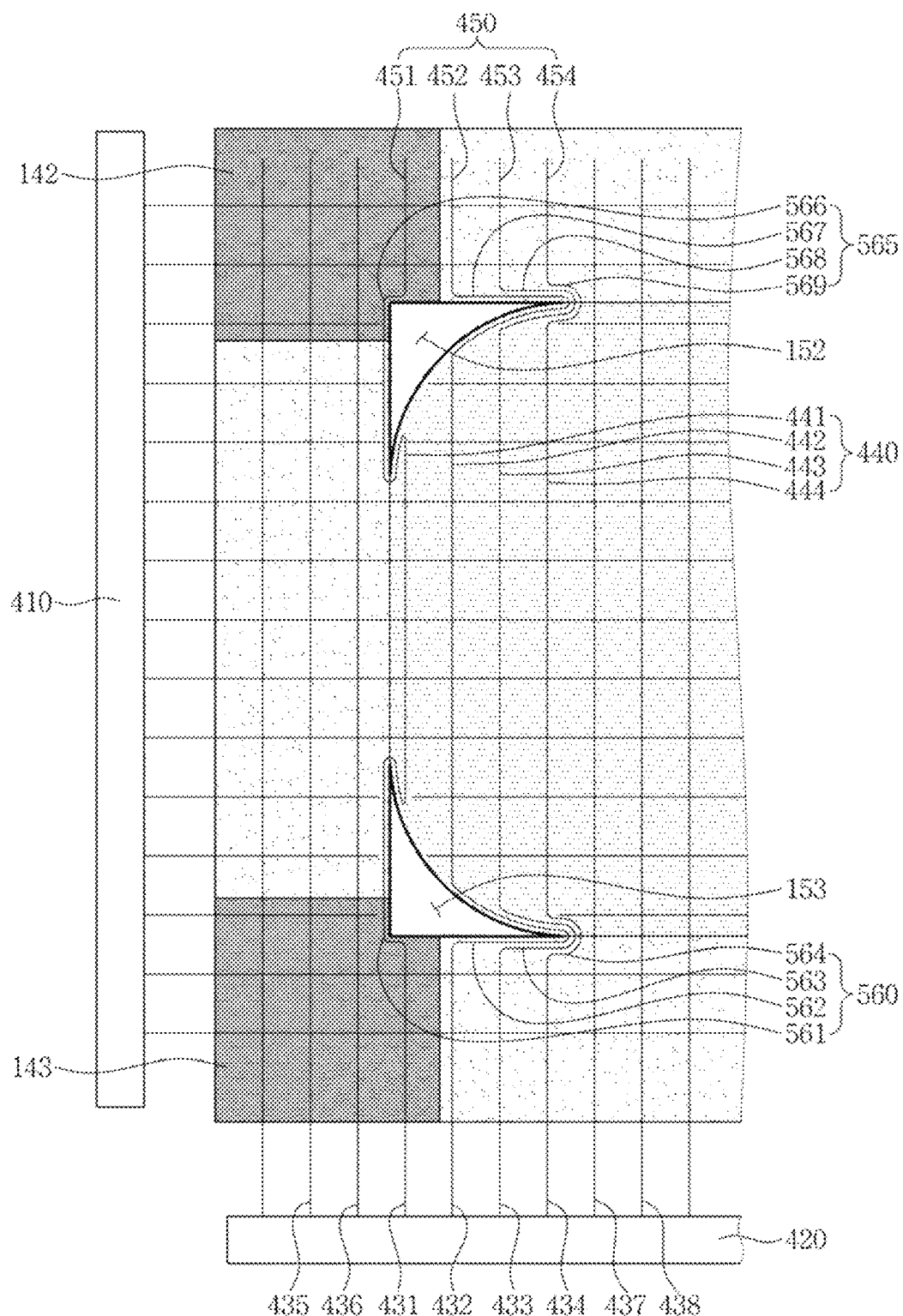

FIG. 12 is a bypass wiring diagram according to an exemplary embodiment of the present invention.

Referring to FIG. 12, bypass wirings 560 (e.g., bypass wirings 561, 562, 563 and 564) and 565 (e.g., bypass wirings 566, 567, 568 and 569) may be formed on a layer substantially the same as a layer on which data lines 431, 432, 433, 434, 435, 436, 437, and 438 are formed, and may be curved around through holes 152 and 153 so as not to intersect other data lines.

Figure 13:
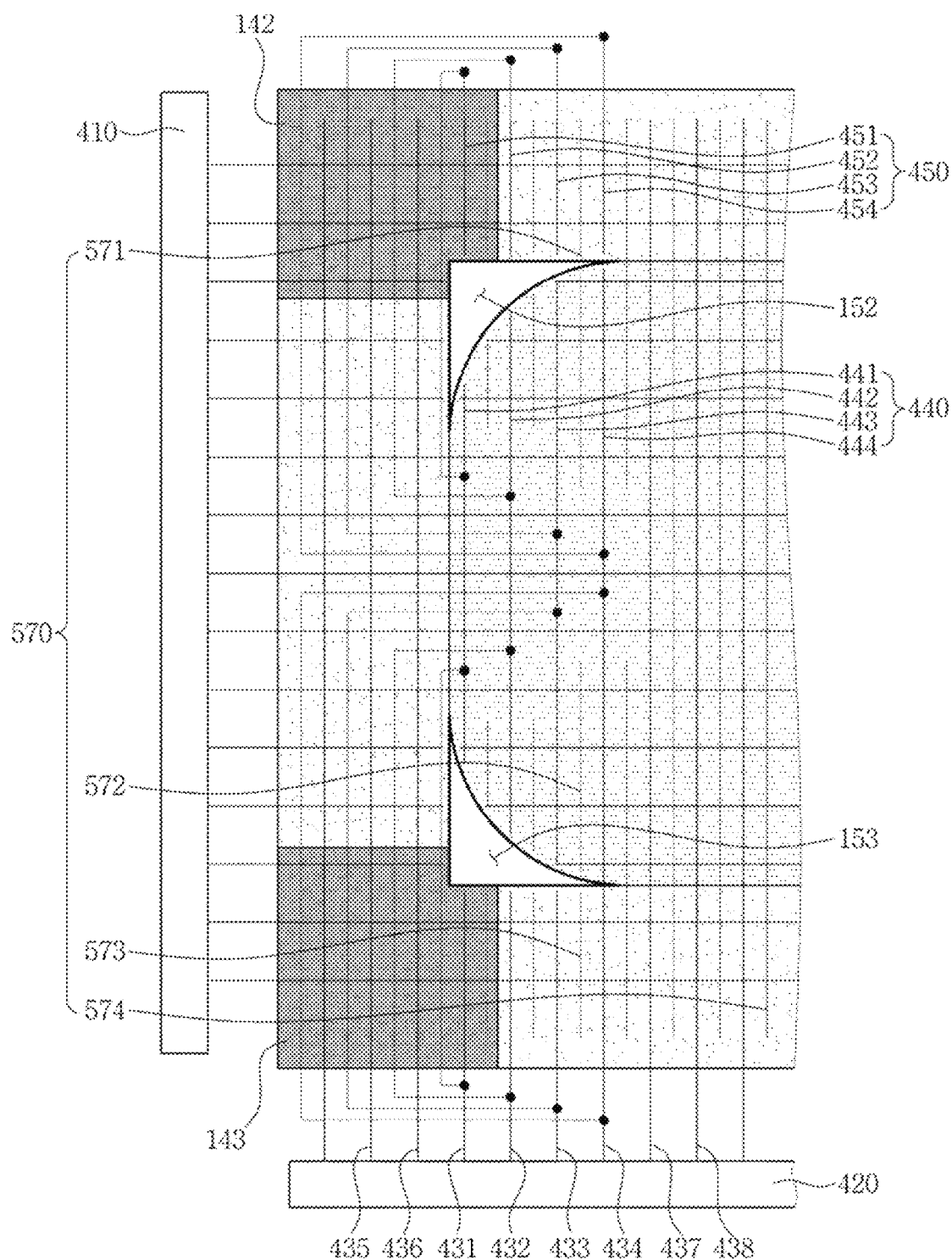

FIG. 13 is a bypass wiring diagram according to an exemplary embodiment of the present invention.

Referring to FIG. 13, to maintain uniformity between portions where bypass wiring is arranged and portions where the bypass wiring is not arranged, dummy wirings 570 (e.g., dummy wirings 571, 572, 573 and 574), having a shape substantially identical to a shape of the bypass wiring, may be disposed at portions where the bypass wiring is not arranged. The dummy wirings 570 need not be connected to any other wiring.

The bypass wirings of the display panel having the through holes have been described above with reference to FIGS. 8 to 13. Although the bypass wirings of the data lines are described by way of example, exemplary embodiments of the present invention are not limited thereto. The gate lines may be divided, similar to the data lines, and a substantially same type of bypass wirings may be provided thereto. The gate driver may also be disposed on both sides of the display panel.

Figure 14B:
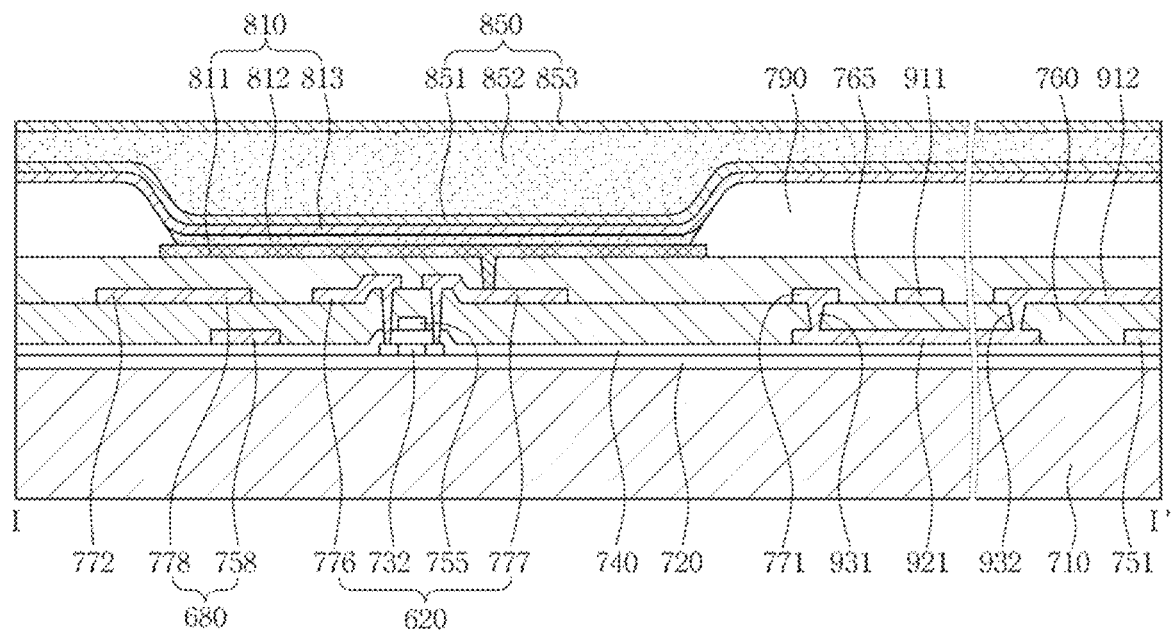
FIG. 14B is a cross-sectional view taken along the line I-I' of FIG. 14A.

FIG. 14A is a partial enlarged view illustrating a part of a display panel according to an exemplary embodiment of the present invention. FIG. 14B is a cross-sectional view taken along the line I-I' of FIG. 14A.

FIG. 14A is a partial enlarged view illustrating a part of a display panel adjacent to the bypass wiring 520 according to an exemplary embodiment of the present invention Referring to FIGS. 14A and 14B, the display panel 100 according to an exemplary embodiment of the present invention may include a plurality of pixels which include a switching thin film transistor ("TFT") 610, a driving TFT 620, a capacitor 680, and an OLED 810. The OLED 810 may be largely applied to flexible display device because they can be deposited at a relatively low temperature, may have relatively low power consumption, and may have relatively high luminance. Herein, the term "pixel" may refer to a smallest unit for displaying an image, and the display panel 100 may display images using a plurality of pixels.

Although each pixel may include two TFTs and one capacitor in the drawings, exemplary embodiments of the present invention are not limited thereto. Each pixel may include three or more TFTs and two or more capacitors, and may further include additional wirings.

The display panel 100 may include a substrate 710, a gate line 751 on the substrate 710, and a data line 771 and a common power line 772 insulated from and crossing the gate line 751. Each pixel may be defined by the gate line 751, the data line 771 and the common power line 772, in which they become a boundary, but exemplary embodiments of the present invention are not limited thereto. The pixels may be defined by a pixel defining layer or a black matrix.

The substrate 710 may include a flexible material. The flexible material may include a plastic material. For example, the substrate 710 may include one of kapton, polyethersulphone (PES), polycarbonate (PC), polyimide (PI), polyethyleneterephthalate (PET), polyethylene naphthalate (PEN), polyacrylate (PAR), or fiber reinforced plastic (FRP).

The substrate 710 may have a thickness in a range from about 5 μm to about 200 μm. When the substrate 710 has a thickness of less than about 5 μm, it may be difficult for the substrate 710 to stably support the OLED 810. On the other hand, when the substrate 710 has a thickness of greater than about 200 μm, the flexible characteristics of the substrate 710 may be degraded.

A buffer layer 720 may be disposed on the substrate 710. The buffer layer 720 may prevent permeation of undesirable elements and may planarize a surface therebelow, and may include suitable materials for planarizing and/or preventing permeation. For example, the buffer layer 720 may include one of a silicon nitride ($SiN_x$) layer, a silicon oxide ($SiO_2$) layer or a silicon oxynitride ($SiO_xN_y$) layer. However, the buffer layer 720 may be omitted depending on the kinds of the substrate 710 and process conditions thereof.

A switching semiconductor layer 731 and a driving semiconductor layer 732 may be disposed on the buffer layer 720. The switching semiconductor layer 731 and the driving semiconductor layer 732 may include at least one of a polycrystalline silicon layer, an amorphous silicon layer, or an oxide semiconductor such as indium gallium zinc oxide (IGZO) or indium zinc tin oxide (IZTO). For example, in the case where the driving semiconductor layer 732 includes a polycrystalline silicon layer, the driving semiconductor layer 732 may include a channel area which is not doped with impurities and p+ doped source and drain areas which are formed on opposite sides of the channel area. In such an exemplary embodiment of the present invention, p-type impurities, such as boron B, may be used as dopant ions, and $B_2H_6$ may be used. Such impurities may vary depending on the kinds of TFTs. The driving TFT 620 according to an exemplary embodiment of the present invention may employ a p-channel metal oxide semiconductor (PMOS) TFT including p-type impurities, but exemplary embodiments of the present invention are not limited thereto. Alternatively, the driving TFT 620 may employ an n-channel metal oxide semiconductor (NMOS) TFT or a complementary metal oxide semiconductor (CMOS) TFT.

A gate insulating layer 740 may be disposed on the switching semiconductor layer 731 and the driving semiconductor layer 732. The gate insulating layer 740 may include at least one of tetraethylorthosilicate (TEOS), silicon nitride ($SiN_x$), or silicon oxide ($SiO_2$). For example, the gate insulating layer 740 may have a double-layer structure where a $SiN_x$ layer having a thickness of about 40 nm and a TEOS layer having a thickness of about 80 nm are sequentially stacked.

A gate wiring which includes gate electrodes 752 and 755 may be disposed on the gate insulating layer 740. The gate wiring may further include the gate line 751, a first capacitor plate 758, and other signal lines. The gate electrodes 752 and 755 may be disposed so as to overlap at least a portion of or the entirety of the semiconductor layers 731 and 732, for example, a channel area thereof. The gate electrodes 752 and 755 may substantially prevent the channel area from being doped with impurities when a source area and a drain area of the semiconductor layers 731 and 732 are doped with impurities during the process of forming the semiconductor layers 731 and 732.

The gate electrodes 752 and 755 and the first capacitor plate 758 may be disposed on a same layer and may include a same metal material as each other. The gate electrodes 752 and 755 and the first capacitor plate 758 may include at least one of molybdenum (Mo), chromium (Cr), or tungsten (W).

An insulating interlayer 760 may be disposed on the gate insulating layer 740 to cover the gate electrodes 752 and 755. The insulating interlayer 760, similar to the gate insulating layer 740, may include silicon nitride (SiNx), silicon oxide (SiOx), or tetraethoxysilane (TEOS), but exemplary embodiments of the present invention are not limited thereto.

A data wiring which includes source electrodes 773 and 776 and drain electrodes 774 and 777 may be disposed on the insulating interlayer 760. The data wiring may include the data line 771, the common power line 772, a second capacitor plate 778, and other wirings. In addition, the source electrodes 773 and 776 and the drain electrodes 774 and 777 may be connected to the source area and the drain area of the semiconductor layers 731 and 732, respectively, through a contact hole defined at the gate insulating layer 740 and the insulating interlayer 760.

As such, the switching TFT 610 may include the switching semiconductor layer 731, the switching gate electrode 752, the switching source electrode 773, and the switching drain electrode 774, and the driving TFT 620 may include the driving semiconductor layer 732, the driving gate electrode 755, the driving source electrode 776, and the driving drain electrode 777. However, configurations of the TFTs 610 and 620 are not limited thereto, and thus may be modified into various structures that are easily conceived by those skilled in the pertinent art.

The capacitor 680 may include the first capacitor plate 758 and the second capacitor plate 778 with the insulating interlayer 760 disposed therebetween.

The switching TFT 610 may function as a switching element to select pixels to perform light emission. The switching gate electrode 752 may be connected to the gate line 751. The switching source electrode 773 may be connected to the data line 771. The switching drain electrode 774 may be spaced apart from the switching source electrode 773 and may be connected to the first capacitor plate 758.

The driving TFT 620 may apply, to a pixel electrode 811, a driving power which allows a light emitting layer 812 of the OLED 810 in the selected pixel to emit light. The driving gate electrode 755 may be connected to the first capacitor plate 758. Each of the driving source electrode 776 and the second capacitor plate 778 may be connected to the common power line 772. The driving drain electrode 777 may be connected to the pixel electrode 811 of the OLED 810 through a contact hole.

With the aforementioned structure, the switching TFT 610 is driven by a gate voltage applied to the gate line 751 and may transmit a data voltage applied to the data line 771 to the driving TFT 620. A voltage equivalent to a difference between a common voltage applied to the driving TFT 620 from the common power line 772 and the data voltage transmitted from the switching TFT 610 may be stored in the capacitor 680, and a current corresponding to the voltage stored in the capacitor 680 may flow to the OLED 810 through the driving TFT 620, such that the OLED 810 may emit light.

A planarization layer 765 may be disposed to cover the data wiring, e.g., the data line 771, the common power line 772, the source electrodes 773 and 776, the drain electrodes 774 and 777, and the second capacitor plate 778, which are patterned using a single mask.

The planarization layer 765 may substantially eliminate a step difference and planarize a surface therebelow to increase luminous efficiency of the OLED 810 to be formed thereon. The planarization layer 765 may include at least one of a polyacrylate resin, an epoxy resin, a phenolic resin, a polyamide resin, a polyimide resin, an unsaturated polyester resin, a polyphenylen ether resin, a polyphenylene sulfide resin, or benzocyclobutene (BCB).

The pixel electrode 811 of the OLED 810 may be disposed on the planarization layer 765. The pixel electrode 811 may be connected to the drain electrode 777 through a contact hole defined at the planarization layer 765.

A pixel defining layer 790 which exposes at least a portion of the pixel electrode 811 to define a pixel area may be disposed on the planarization layer 765. The pixel electrode 811 may be disposed in a position corresponding to the pixel area which is defined by the pixel defining layer 790. The pixel defining layer 790 may include a resin such as a polyacrylate resin or a polyimide resin.

The light emitting layer 812 may be disposed on the pixel electrode 811 in the pixel area, and a common electrode 813 may be disposed on the pixel defining layer 790 and the light emitting layer 812. The light emitting layer 812 may include a relatively low molecular weight organic material or a relatively high molecular weight organic material. At least one of a hole injection layer or a hole transport layer may further be disposed between the pixel electrode 811 and the light emitting layer 812, and at least one of an electron transport layer and an electron injection layer may further be disposed between the light emitting layer 812 and the common electrode 813.

The pixel electrode 811 and the common electrode 813 may be formed as one of a transmissive electrode, a transflective electrode or a reflective electrode.

A transparent conductive oxide ("TCO") may be used to form a transmissive electrode. Such TCO may include at least one of indium tin oxide (ITO), indium zinc oxide (IZO), zinc oxide (ZnO), or indium oxide ($In_2O_3$).

A metal, e.g., magnesium (Mg), silver (Ag), gold (Au), calcium (Ca), lithium (Li), chromium (Cr), aluminum (Al), or copper (Cu), or an alloy thereof may be used to form a transflective electrode and a reflective electrode. In such an exemplary embodiment of the present invention, whether an electrode is a transflective type or a reflective type depends on the thickness of the electrode. Typically, the transflective electrode has a thickness of about 200 nm or less and the reflective electrode has a thickness of about 300 nm or more. As the thickness of the transflective electrode decreases, light transmittance and resistance increase. On the contrary, as the thickness of the transflective electrode increases, light transmittance decreases.

In addition, the transflective electrode and the reflective electrode may have a multilayer structure which includes a metal layer including a metal or a metal alloy and a TCO layer stacked on the metal layer.

A thin film encapsulation layer 850 may be disposed on the common electrode 813. The thin film encapsulation layer 850 may include one or more inorganic layers (e.g., inorganic layers 851 or 853) and one or more organic layers (e.g., organic layer 852). The one or more inorganic layers (e.g., inorganic layers 851 or 853) may be alternately stacked with the one or more organic layers (e.g., organic layer 852). In such an exemplary embodiment of the present invention, the inorganic layer 851 may be disposed at a lowermost portion. Thus, the inorganic layer 851 may be disposed immediately adjacent to the OLED 810.

The thin film encapsulation layer 850 may include two inorganic layers 851 and 853 and one organic layer 852, but exemplary embodiments of the present invention are not limited thereto.

The inorganic layers 851 and 853 may include one or more inorganic materials of $Al_2O_3$, $TiO_2$, ZrO, $SiN_x$, $SiO_2$, AlON, AlN, SiON, $Si_3N_4$, ZnO, or $Ta_2O_5$. The inorganic layers 851 and 853 may be formed through methods such as a chemical vapor deposition (CVD) method or an atomic layer deposition (ALD) method. However, exemplary embodiments of the present invention are not limited thereto, and the inorganic layers 851 and 853 may be formed using various methods known to those skilled in the pertinent art.

The organic layer 852 may include a polymer-based material. Examples of the polymer-based material may include, for example, an acrylic resin, an epoxy resin, polyimide or polyethylene. The organic layer 852 may be formed through a thermal deposition process. The thermal deposition process for forming the organic layer 852 may be performed in a range of temperature that might not damage the OLED 810. However, exemplary embodiments of the present invention are not limited thereto, and the organic layer 852 may be formed using various methods known to those skilled in the pertinent art.

The inorganic layers 851 and 853 which may have a relatively high density of thin film may substantially prevent or reduce infiltration of, for example, moisture or oxygen. Thus, permeation of moisture and oxygen into the OLED 810 may be largely prevented by the inorganic layers 851 and 853.

The thin film encapsulation layer 850 may have a thickness less than or equal to about 10 μm. Accordingly, an overall thickness of the display panel 100 may be relatively small. As such an encapsulation layer 850 may be applied, and the display panel 100 may have flexible characteristics.

Referring to FIGS. 14A and 14B, a bypass wiring 921 (e.g., at least one of the bypass wirings 520 in FIG. 9) in the transverse direction may be located between the gate lines 751 on a same layer as a layer on which the gate line 751 is formed. In addition, bypass wirings 911 and 912 (e.g., bypass wirings 540 in FIG. 9) in the longitudinal direction may be located between the data lines 771 on a same layer as a layer on which the data line 771 is formed. The bypass wiring 921 (e.g., at least one of bypass wirings 520 in FIG. 9) in the transverse direction may be connected to the data line 771 (e.g., data lines 440 in FIG. 8) which is divided by a contact hole 931 (e.g., one of contact holes 525 in FIG. 9), and may be connected to the bypass wirings 912 (e.g., at least one of bypass wirings 540 in FIG. 9) in the longitudinal direction through a contact hole 932 (e.g., one of other contact holes positioned along bypass wirings 520 opposite the contact holes 525 in FIG. 9).

In an exemplary embodiment of the present invention, a bypass wiring (e.g., one of bypass wirings 510 or 530 in FIG. 9) in the transverse direction disposed at the non-display portion 171 may be located on a same layer as a layer on which the gate line 751 is disposed. The bypass wirings 911 and 912 (e.g., bypass wirings 540 in FIG. 9) in the longitudinal direction may extend to the outermost non-display portion 171. In addition, similarly, the bypass wiring (e.g., bypass wirings 510 and 530 in FIG. 9) in the transverse direction may be connected to the data line 771 (e.g., data lines 430 and 450 in FIG. 8) which is divided by a contact hole (e.g., contact holes 515 and 535 in FIG. 9), and may be connected to the bypass wiring 912 (e.g., bypass wirings 540 in FIG. 9) in the longitudinal direction through contact holes (e.g., contact holes disposed at opposite ends of bypass wirings 540 in FIG. 9).

In addition, the bypass wirings 911 and 912 (e.g., bypass wirings 540 in FIG. 9) in the longitudinal direction may be disposed at the non-display portion 171, and may be located on a same layer as a layer on which the data lines 771 are formed. In an exemplary embodiment of the present invention, the bypass wiring in the transverse direction may extend to the outermost non-display portion 171.

Figure 15A:
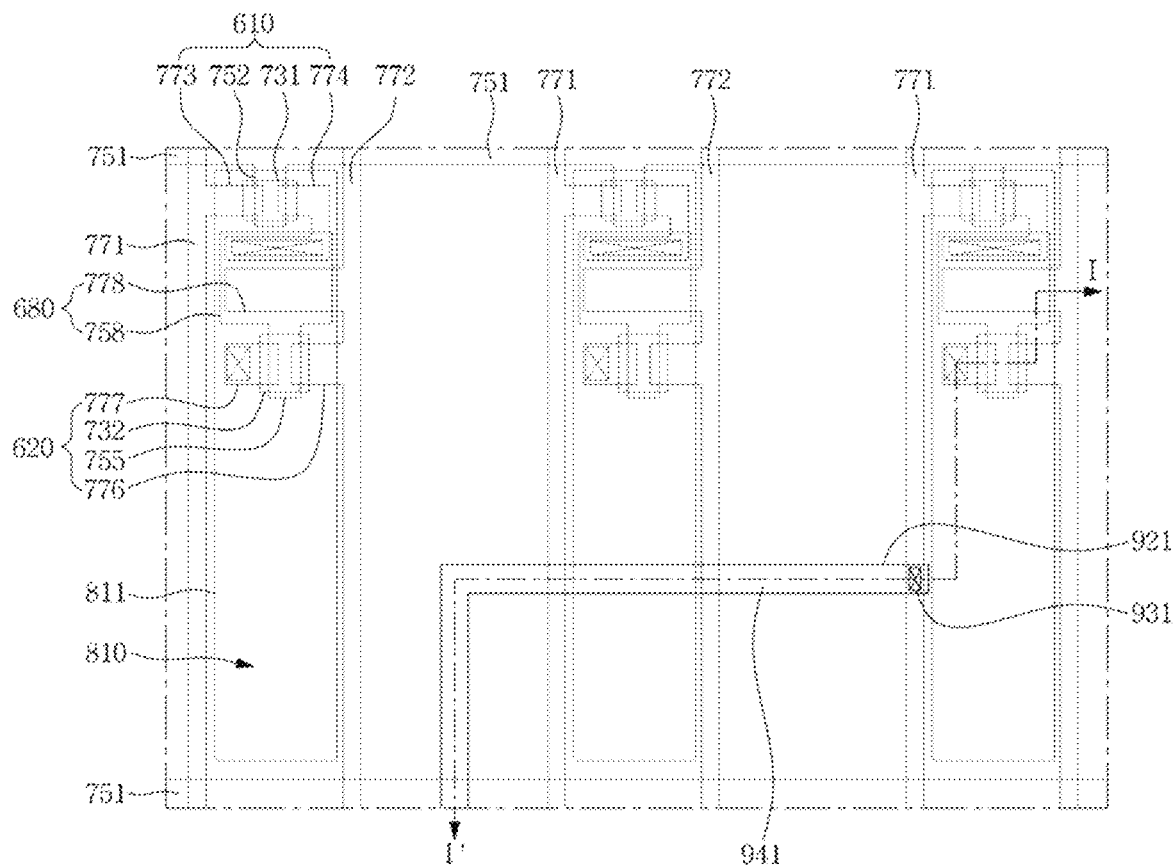
FIG. 15A is a partial enlarged view illustrating a part of a display panel according to an exemplary embodiment of the present invention.
Figure 15B:
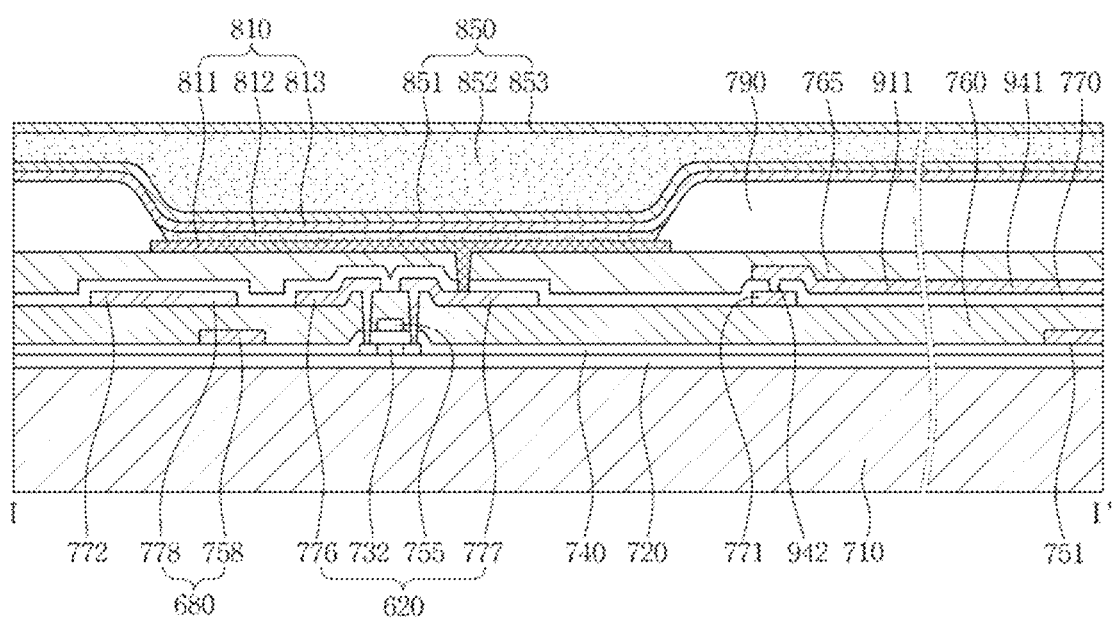
FIG. 15B is a cross-sectional view taken along the line I-I' of FIG. 15A.

FIG. 15A is a partial enlarged view illustrating a part of a display panel according to an exemplary embodiment of the present invention. FIG. 15B is a cross-sectional view taken along the line I-I' of FIG. 15A.

FIG. 15A is a partial enlarged view illustrating a part of a display panel adjacent to the bypass wiring 460. Descriptions of components that are the same or substantially the same as those described above with reference to FIGS. 14A and 14B may be omitted below.

Referring to FIGS. 15A and 15B, an insulating interlayer 770 may be stacked on a same layer as a layer on which a data line is formed. The insulating interlayer 770 may include a same material as a material included in the insulating interlayer 760. A bypass wiring 941 may be formed on the insulating interlayer 770, and may be spaced apart from all other wirings (e.g., the gate line 751 and the data line 771). One end of the bypass wiring 941 (e.g., at least one of bypass wirings 460 in FIG. 8) may be connected to the data line 771 (e.g., at least one of data lines 440 in FIG. 8) which is divided by a contact hole 942 (e.g., at least one of contact holes 480 in FIG. 8). The planarization layer 765 may be formed on the bypass wiring 941.

Another end of the bypass wiring 941 (e.g., at least one of bypass wirings 460 in FIG. 8) may be connected to the data line 771 (e.g., at least one of data lines 431, 432, 433, and 434 in FIG. 8) which is divided by a contact hole (e.g., at least one of contact holes 470 in FIG. 8) defined in the insulating interlayer 770.

Although the bypass wiring 941 may be located higher than a layer on which the data line is formed, exemplary embodiments of the present invention are not limited thereto. The bypass wiring 941 may be disposed between a layer on which the data line is formed and a layer on which the gate line is formed, and may be located below the layer on which the gate line is formed.

As set forth hereinabove, according to an exemplary embodiment of the present invention, various types of 3D display devices may be formed and signals may be applied to wirings, divided by a through hole, through a bypass wiring around the through hole.

While the present invention has been illustrated, and described with reference to the exemplary embodiments thereof, it will be apparent to those of ordinary skill in the art that various changes in form and detail may be formed thereto without departing from the spirit, and scope of the present invention.

What is claimed is:

1. A display device comprising:
a substrate,
wherein the substrate comprises:
a front surface display portion;
a first side surface display portion bent from a first side of the front surface display portion;
a second side surface display portion bent from a second side of the front surface display portion; and
a corner display portion extending from the first side surface display portion and the second side surface display portion, and
wherein the substrate has a through hole defined by the front surface display portion and the corner display portion, the through hole being spaced apart from a periphery of the substrate.

2. The display device of claim 1, wherein the corner display portion comprises a first side surface corner display portion extending from the first side surface display portion, a second side surface corner display portion extending from the second side surface display portion, and a corner non-display portion between the first side surface corner display portion and the second side surface corner display portion.

3. The display device of claim 2, wherein the corner non-display portion comprises a first folding portion bent and extending from the first side surface corner display portion and a second folding portion bent and extending from the first folding portion and the second side surface corner display portion, and
wherein at least a portion of the first folding portion is in direct contact with at least a portion of the second folding portion.

4. The display device of claim 3, wherein the first folding portion and the second folding portion overlap one of the first side surface corner display portion and the second side surface corner display portion.

5. The display device of claim 2, wherein the corner non-display portion does not comprise a pixel electrode.

6. The display device of claim 1, wherein the front surface display portion has a rounded corner.

7. The display device of claim 6, wherein the corner display portion has a round shape corresponding to a shape of the corner of the front surface display portion.

8. The display device of claim 1, further comprising:
a plurality of pixels on the substrate and arranged in a matrix form;
a plurality of gate lines extending along a first direction and providing a gate signal to each of the plurality of pixels; and
a plurality of data lines extending along a second direction crossing the first direction and providing a data signal to each of the plurality of pixels.

9. The display device of claim 8, wherein at least one of the plurality of data lines and the plurality of gate lines comprises a first divided wiring and a second divided wiring which are divided by the through hole, and comprises a bypass wiring which bypasses the through hole and connects the first divided wiring and the second divided wiring.

10. The display device of claim 9, wherein the bypass wiring is disposed so that an insulating layer is disposed between the bypass wiring and each of the first and second divided wirings, and
the bypass wiring is connected to the first and second divided wirings through contact holes defined at the insulating layer.

11. The display device of claim 10, wherein at least one of the contact holes is located at the front surface display portion.

12. The display device of claim 9, further comprising a dummy wiring.

13. The display device of claim 8, wherein at least one of the plurality of gate lines and the plurality of data lines is curved along a periphery of the through hole.

14. The display device of claim 8, further comprising a gate driver arranged to apply a gate signal to the gate lines divided by the through hole.

15. The display device of claim 8, further comprising a data driver arranged to apply a data signal to the data lines divided by the through hole.

16. The display device of claim 8, further comprising a demultiplexer arranged to apply a data signal to the data lines divided by the through hole.

* * * * *